United States Patent
Imura

(10) Patent No.: US 8,436,603 B2
(45) Date of Patent: May 7, 2013

(54) VOLTAGE REGULATOR OPERABLE TO SWITCH BETWEEN A TWO-STAGE STRUCTURE OPERATION AND A THREE-STAGE STRUCTURE OPERATION

(75) Inventor: Takashi Imura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 310 days.

(21) Appl. No.: 12/888,899

(22) Filed: Sep. 23, 2010

(65) Prior Publication Data

US 2011/0074508 A1 Mar. 31, 2011

(30) Foreign Application Priority Data

Sep. 29, 2009 (JP) ................................. 2009-225467
Nov. 13, 2009 (JP) ................................. 2009-260332

(51) Int. Cl.
*G05F 3/04* (2006.01)
*G05F 3/08* (2006.01)
*G05F 3/16* (2006.01)
*G05F 3/20* (2006.01)

(52) U.S. Cl.
USPC .......................................... 323/312; 323/313

(58) Field of Classification Search ........... 323/312–316
See application file for complete search history.

(56) References Cited

U.S. PATENT DOCUMENTS

| | | | |
|---|---|---|---|
| 6,236,194 B1 | 5/2001 | Manabe et al. | |
| 6,281,668 B1* | 8/2001 | Sudo | 323/299 |
| 6,819,602 B2* | 11/2004 | Seo et al. | 365/193 |
| 7,129,786 B2* | 10/2006 | Kim et al. | 330/297 |
| 7,368,896 B2* | 5/2008 | Nagata et al. | 323/280 |
| 2002/0041531 A1* | 4/2002 | Tanaka et al. | 365/205 |
| 2009/0121693 A1* | 5/2009 | Noda | 323/273 |
| 2009/0278518 A1* | 11/2009 | Takagi | 323/282 |

FOREIGN PATENT DOCUMENTS

JP 03-158912 A 7/1991
JP 2002-287833 A 10/2002

* cited by examiner

*Primary Examiner* — Adolf Berhane
*Assistant Examiner* — Emily Pham
(74) *Attorney, Agent, or Firm* — Brinks Hofer Gilson & Lione

(57) ABSTRACT

Provided is a voltage regulator having a structure in which an output terminal of a first differential amplifier circuit is connected to a second differential amplifier circuit to control an output transistor by the second differential amplifier circuit. When low current consumption is required, the first differential amplifier circuit is suspended. When high-speed response is required, the first differential amplifier circuit is activated. The low-current consumption operation and the high-speed operation are switched with a minimum circuit area.

12 Claims, 18 Drawing Sheets

VOLTAGE REGULATOR OPERABLE TO SWITCH BETWEEN A TWO-STAGE STRUCTURE OPERATION AND A THREE-STAGE STRUCTURE OPERATION

RELATED APPLICATIONS

This application claims priority under 35 U.S.C. §119 to Japanese Patent Application Nos. 2009-225467 filed on Sep. 29, 2009 and 2009-260332 filed on Nov. 13, 2009, the entire content of which is hereby incorporated by reference.

BACKGROUND OF THE INVENTION

1. Field of the Invention

The present invention relates to a voltage regulator for generating a constant voltage, and more particularly, to a control circuit for controlling operating states of a plurality of differential amplifiers to obtain operating states suitable for low current consumption and high-speed operation.

2. Description of the Related Art

In recent years, with the spread of mobile devices, market demands for compact and light batteries have been increased. In contrast, an operating time of the mobile devices greatly influences product differentiation. Therefore, reduction in power consumption of electronic circuitry is an absolute must.

One of the solutions is to perform fine-grained control of functional circuits of a mobile device based on a device state. For example, a practical attempt has been made at integrated circuit level to allow only a minimum number of functional circuits to operate during standby, to thereby suppress an increase in power consumption.

A voltage regulator is required to adjust, to a constant voltage, a time-varying power supply voltage, for example, a battery voltage, and supply the power supply voltage to the functional circuits. In general, in order to improve a power supply voltage rejection ratio and transient response characteristic of the voltage regulator, it is necessary to increase current consumption of the voltage regulator.

A conventional voltage regulator is illustrated in FIG. 5. FIG. 5 illustrates a circuit having a two-stage structure in which an output transistor is directly driven based on an output of a differential amplifier as described in Japanese Patent Application Laid-open No. Hei 03-158912 (FIG. 2). In the structure, the number of through paths is small and thus the current consumption may be reduced, but there is a problem that it is difficult to significantly improve the power supply voltage rejection ratio and the transient response characteristic.

As a structure for solving the problem of the structure illustrated in FIG. 5, a three-stage structure in which an intermediate stage is provided between the differential stage and the output stage as illustrated in FIG. 6 is widely used. When the three-stage structure is used, the power supply voltage rejection ratio and the transient response characteristic may be significantly improved, but the number of through paths increases. Therefore, the three-stage structure is not suitable to achieve low power consumption.

As one of the methods of balancing the contradictory features described above, it is conceivable to set, to the voltage regulator, an operating state in which the power supply voltage rejection ratio and the transient response characteristic are high and thus current consumption is large and an operating state in which the power supply voltage rejection ratio and the transient response characteristic are low and thus current consumption is small, and manually or automatically switch between the operating states based on an operating state of a functional circuit which is a load.

For example, in Japanese Patent Application Laid-open No. 2002-287833 (FIG. 1), a plurality of voltage regulators having different characteristics are connected in parallel and the start and stop of the plurality of voltage regulators are controlled based on a load state to optimize the current consumption of the voltage regulators based on the load state.

However, the structure described in Japanese Patent Application Laid-open No. 2002-287833 (FIG. 1) requires the output transistors equal in number to circuits to be switched, leading to an increase in chip area. A gate terminal of each of the output transistors has a relatively large parasitic capacitance. Therefore, when the plurality of output transistors are switched, a charge and discharge time becomes long. Thus, there is a problem that a fluctuation in output voltage during switching is large.

There may be also a method of using a common output transistor to switch between a plurality of amplifying units each of which corresponds to the amplifying unit as illustrated in FIG. 5 or 6. However, even in this case, it is necessary to prepare a plurality of differential amplifiers, and hence the chip area increases. Therefore, there is a problem that it is difficult to reduce a cost.

SUMMARY OF THE INVENTION

The present invention has been made to overcome the above-mentioned problems, and provides a voltage regulator including: a reference voltage circuit connected between a power supply input terminal and a ground terminal, for generating a reference voltage which is constant, independently of a power supply input; an output transistor connected between the power supply input terminal and an output voltage terminal, for generating an output voltage which is constant, independently of an output current; a voltage dividing circuit connected between the output voltage terminal and the ground terminal, for dividing the output voltage to generate a referred voltage; a first differential amplifier circuit for generating a first differential amplifier output voltage based on the reference voltage received as a non-inverting input and the referred voltage received as an inverting input; a second differential amplifier circuit for controlling a control terminal of the output transistor based on the output voltage, the referred voltage received as a non-inverting input, the reference voltage received as a first inverting input, and the first differential amplifier output voltage received as a second inverting input; at least one bias circuit for supplying a bias current to the first differential amplifier circuit and the second differential amplifier circuit; and a control circuit for controlling the first differential amplifier circuit and the second differential amplifier circuit based on an operation control signal having at least a binary value, in which when the operation control signal has a first logic value, the first differential amplifier circuit is in a suspended state, and when the operation control signal has a second logic value, the first differential amplifier circuit is in an operating state.

The operation control signal may be automatically switched in an internal portion based on a load current or may be set from an outside of the voltage regulator.

According to the feature of the structure in this application, a voltage regulator having a two-stage structure suitable for low-current consumption operation and a voltage regulator having a three-stage structure suitable for high-speed response may be automatically or externally switched. In addition, a mounting area is smaller than in a case where amplifying units are separately prepared for the voltage regulator having the two-stage structure and the voltage regulator having the three-stage structure.

DETAILED DESCRIPTION OF THE PREFERRED EMBODIMENTS

Figure 1:
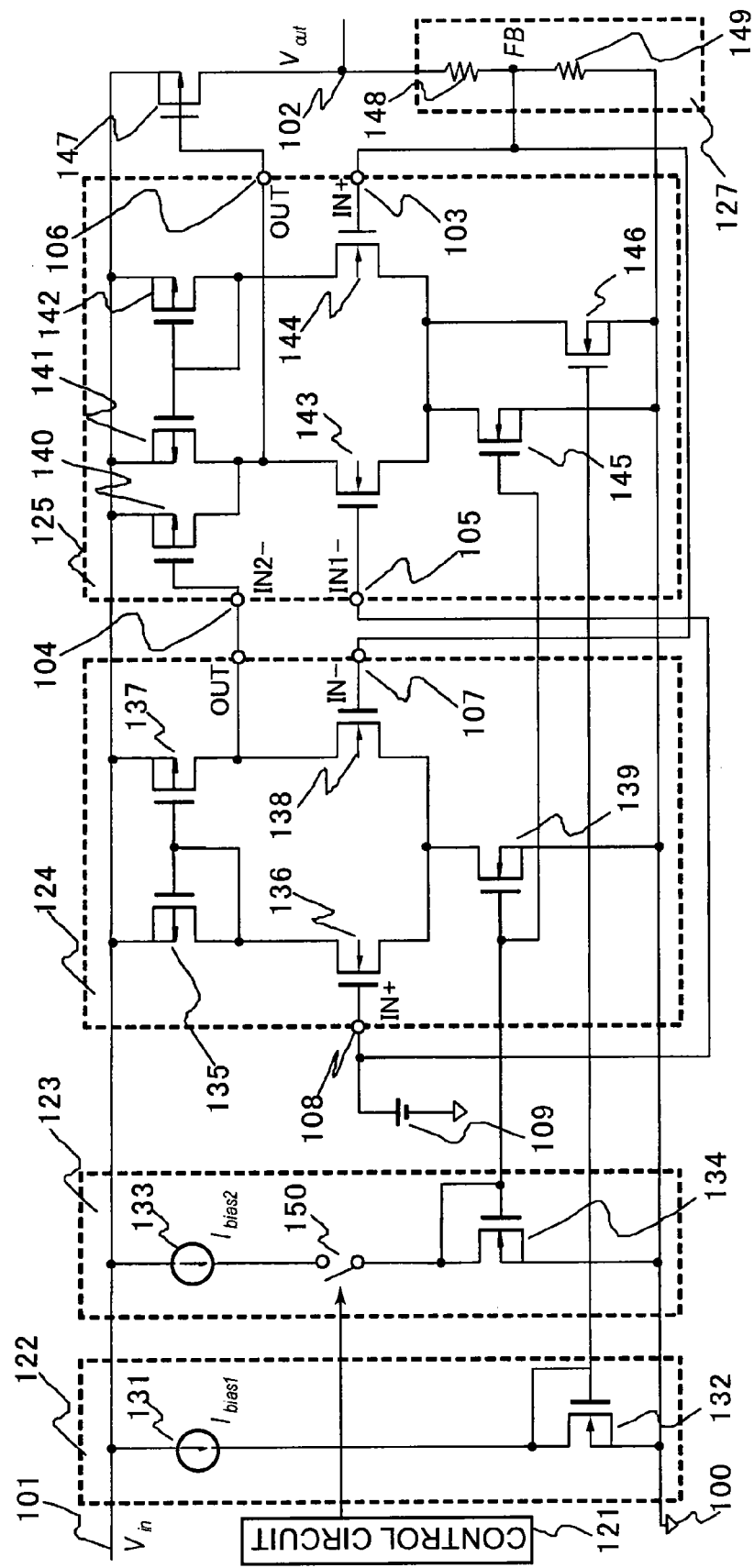
FIG. 1 illustrates a voltage regulator according to a first embodiment of the present invention.

Hereinafter, embodiments of the present invention are described in detail with reference to the attached drawings.
First Embodiment FIG. 1 is a circuit diagram illustrating a voltage regulator according to a first embodiment of the prevent invention.

The voltage regulator according to the first embodiment includes a reference voltage circuit 109, an output transistor 147, a voltage dividing circuit 127, differential amplifier circuits 124 and 125, bias circuits 122 and 123, and a control circuit 121.

Next, the connection of the constituent circuits of the voltage regulator according to the first embodiment is described.

An output terminal of the reference voltage circuit 109 is connected to a non-inverting input terminal 108 of the differential amplifier circuit 124 and an inverting input terminal 105 of the differential amplifier circuit 125. An output terminal of the differential amplifier circuit 124 is connected to an input terminal 104 of the differential amplifier circuit 125. An output terminal of the differential amplifier circuit 125 is connected to a gate of the output transistor 147. A drain of the output transistor 147 is connected to an output terminal 102 and a source thereof is connected to a power supply terminal 101. The output terminal 102 is connected to the voltage dividing circuit 127. A connection point between resistors 148 and 149 included in the voltage dividing circuit 127 is connected to an inverting input terminal 107 of the differential amplifier circuit 124 and a non-inverting input terminal 103 of the differential amplifier circuit 125. An end of the resistor 149 which is opposed to the connection point is connected to a ground terminal 100. An output terminal of the bias circuit 122 is connected to the differential amplifier circuit 125 to supply a bias current thereto. An output terminal of the bias circuit 123 is connected to the differential amplifier circuits 124 and 125 to supply a bias current thereto.

The connection of the differential amplifier circuit 124 is described.

A gate of an N-channel transistor 136 is connected to the non-inverting input terminal 108, a source thereof is connected to a drain of an N-channel transistor 139, and a drain thereof is connected to a gate and drain of a P-channel transistor 135. A source of the P-channel transistor 135 is connected to the power supply terminal 101. A gate of a P-channel transistor 137 is connected to the gate of the P-channel transistor 135, a drain thereof is connected to a drain of an N-channel transistor 138 and the input terminal 104 of the differential amplifier circuit 125, and a source thereof is connected to the power supply terminal 101. The P-channel transistors 135 and 137 serve as a current mirror circuit. A gate of the N-channel transistor 138 is connected to the inverting input terminal 107 and a source thereof is connected to the drain of the N-channel transistor 139. A gate of the N-channel transistor 139 is connected to a gate of an N-channel transistor 134 of the bias circuit 123 and a source thereof is connected to the ground terminal 100. The connection of the differential amplifier circuit 125 is described. A gate of an N-channel transistor 143 is connected to the inverting input terminal 105, a source thereof is connected to drains of N-channel transistors 145 and 146, and a drain thereof is connected to drains of P-channel transistors 140 and 141 and the output terminal 106. A gate of the P-channel transistor 140 is connected to the input terminal 104 and a source thereof is connected to the power supply terminal 101.

A gate of the P-channel transistor 141 is connected to a gate and drain of a P-channel transistor 142 and a source thereof is connected to the power supply terminal 101. The gate and drain of the P-channel transistor 142 are connected to a drain of an N-channel transistor 144 and a source thereof is connected to the power supply terminal 101. The P-channel transistors 141 and 142 serve as a current mirror circuit. A gate of the N-channel transistor 144 is connected to the non-inverting input terminal 103 and a source thereof is connected to the drains of the N-channel transistors 145 and 146. A gate of the N-channel transistor 145 is connected to the gate of the N-channel transistor 134 of the bias circuit 123 and a source thereof is connected to the ground terminal 100. A gate of the N-channel transistor 146 is connected to a gate of an N-channel transistor 132 of the bias circuit 122 and a source thereof is connected to the ground terminal 100.

The connection of the bias circuit 122 is described.

The gate and drain of the N-channel transistor 132 are connected to a constant current circuit 131 and the gate of the N-channel transistor 146 of the differential amplifier circuit 125, and a source thereof is connected to the ground terminal 100. The connection of the bias circuit 123 is described. The gate and drain of the N-channel transistor 134 are connected to one side of a switching circuit 150, the gate of the N-channel transistor 139 of the differential amplifier circuit 124, and the gate of the N-channel transistor 145 of the differential amplifier circuit 125, and a source thereof is connected to the ground terminal 100. The opposite side of the switching circuit 150 is connected to a constant current circuit 133. The switching circuit 150 receives an output of the control circuit 121 as a switching signal.

Figure 2:
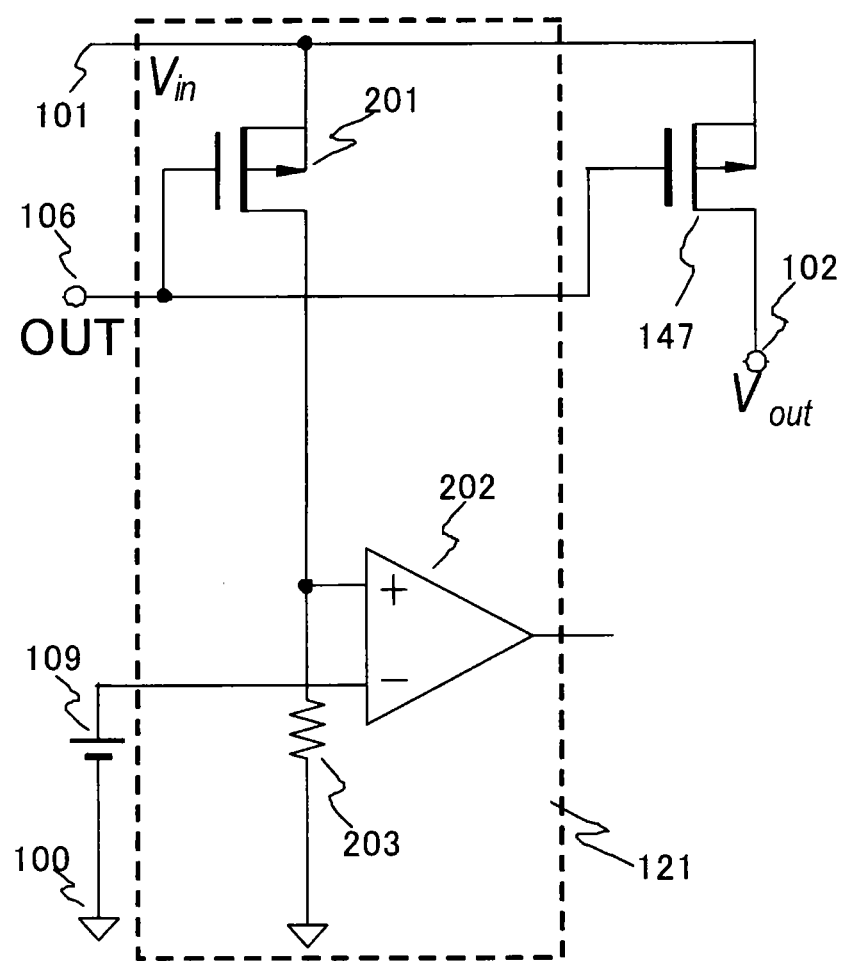
FIG. 2 illustrates an example of a control circuit in the first embodiment of the present invention.

FIG. 2 is a circuit diagram illustrating the control circuit 121. The connection of the control circuit 121 is described.

A P-channel transistor 201 includes a gate connected to the output terminal 106 of the differential amplifier circuit 125, a drain connected to one side of a resistor 203 and a non-inverting input terminal of a comparator 202, and a source connected to the power supply terminal 101. The opposite side of the resistor 203 is connected to the ground terminal 100. An inverting input terminal of the comparator 202 is connected to the reference voltage circuit 109. An output of the comparator 202 is supplied as the switching signal to the switching circuit 150.

Next, an operation of the voltage regulator according to this embodiment is described.

The bias circuit 123 supplies the bias current to the differential amplifier circuits 124 and 125. The bias circuit 122 supplies the bias current to the differential amplifier circuit 125. Note that, the current supplied from the bias circuit 123 to the differential amplifier circuit 125 is set to a value larger than the current supplied from the bias circuit 122 to the differential amplifier circuit 125.

The control circuit 121 has a function of suspending the bias circuit 123 based on a control signal. As illustrated in FIG. 2, the P-channel transistor 201 is connected in parallel to the output transistor 147, and a current Tout flowing through the output transistor 147 is caused to flow into the resistor 203, to thereby obtain a voltage Vdet proportional to an output current.

Assume that the output transistor 147 and the P-channel transistor 201 are of the same type, an aspect ratio is set to M:1, and a resistance value of the resistor 203 is denoted by R. In this case, the voltage Vdet is expressed by Expression (1).

$$Vdet = Iout \cdot R/M \quad (1)$$

The reference voltage circuit 109 supplies a voltage Vref to the inverting input terminal of the comparator 202. In this case, a condition in which the output of the comparator 202 is in an "H" level is expressed by Expression (2).

$$Iout \cdot R/M > Vref \quad (2)$$

Assume that the output of the comparator 202 is the control signal of the control circuit 121, an "L" level indicates a first logic value, and the "H" level indicates a second logic value. When the control signal is used, the switching circuit 150 may be switched based on the load current.

When the control circuit 121 takes the first logic value to turn off the switching circuit 150, the bias circuit 123 and the differential amplifier circuit 124 stop operating. In this case, the voltage regulator forms a two-stage structure suitable for low-current consumption operation, which includes the differential amplifier circuit 125 and the output transistor 147. The differential amplifier circuit 125 may operate with a very small current supplied only from the bias circuit 122, and hence the current consumption of the voltage regulator may be suppressed to a low value.

In contrast to this, when the control circuit 121 takes the second logic value to turn on the switching circuit 150, the bias circuit 123 and the differential amplifier circuit 124 become an operating state. In this state, it may be assumed that the regulator has a three-stage structure including the differential amplifier circuits 124 and 125 and the output transistor 147. Because the regulator has the three-stage structure, a power supply voltage rejection ratio and a transient response characteristic are improved. The sufficient currents are supplied to the differential amplifier circuits 124 and 125, and hence the power supply voltage rejection ratio and the transient response characteristic are significantly improved.

As described above, according to the voltage regulator in this embodiment, with a small occupied area, automatic switching may be achieved between the two-stage structure operation suitable for low current consumption and the three-stage structure operation by which a high power supply voltage rejection ratio and an excellent transient response characteristic are obtained.

Second Embodiment

Figure 3:
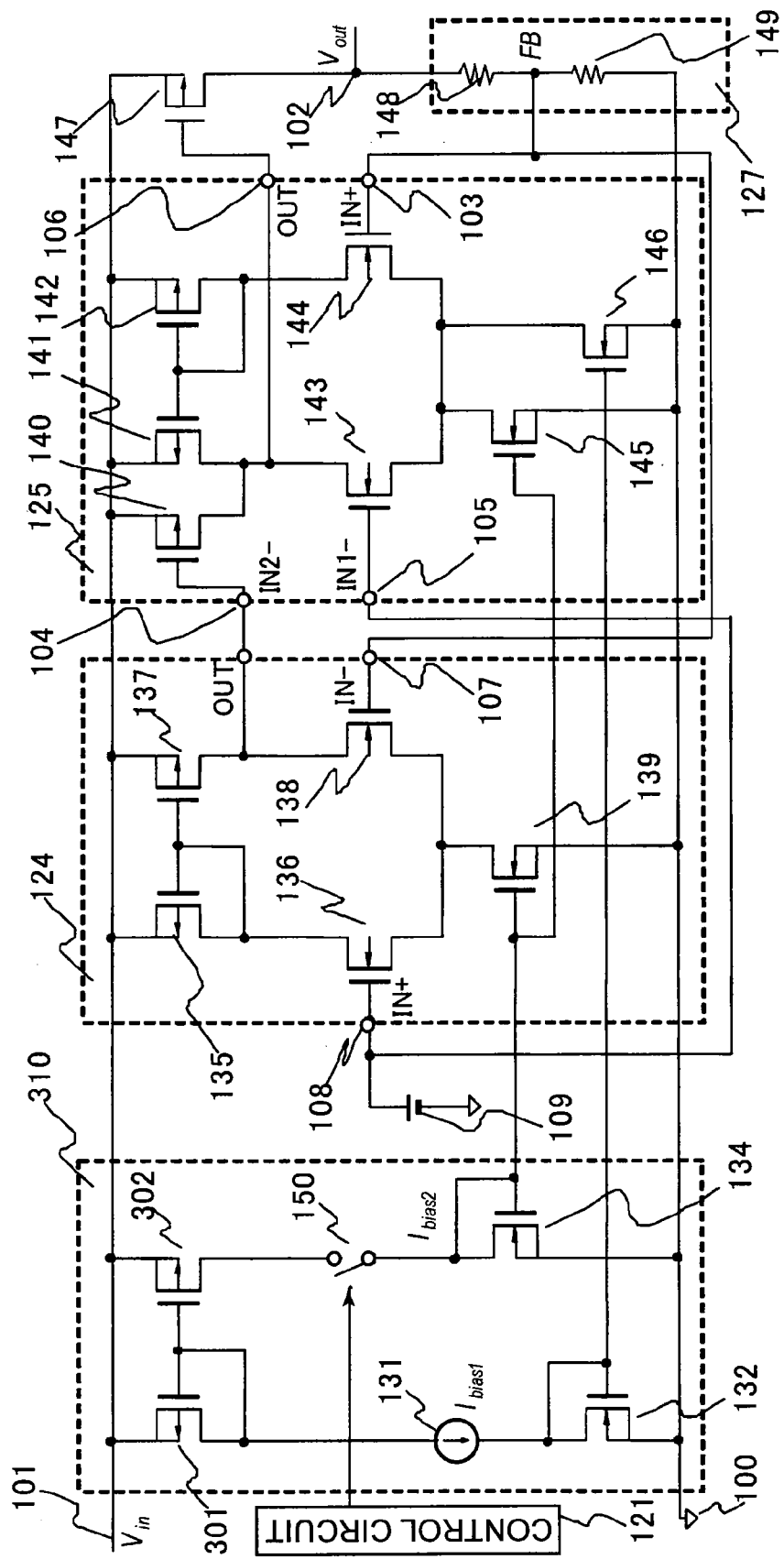
FIG. 3 illustrates a voltage regulator according to a second embodiment of the present invention.

FIG. 3 is a circuit diagram illustrating a voltage regulator according to a second embodiment of the present invention.

The voltage regulator according to the second embodiment includes the reference voltage circuit 109, the output transistor 147, the voltage dividing circuit 127, the differential amplifier circuits 124 and 125, a bias circuit 310, and the control circuit 121. FIG. 3 is different from FIG. 1 in that the bias circuit 310 is provided instead of the bias circuits 122 and 123.

Next, the connection of the constituent circuits of the voltage regulator according to the second embodiment is described.

The connection of the bias circuit 310 is described.

A gate and drain of a P-channel transistor 301 are connected to the constant current circuit 131 and a gate of a P-channel transistor 302, and a source thereof is connected to the power supply terminal 101. A drain of the P-channel transistor 302 is connected to the switching circuit 150 and a source thereof is connected to the power supply terminal 101. The gate and drain of the N-channel transistor 132 are connected to the constant current circuit 131 and the gate of the N-channel transistor 146 of the differential amplifier circuit 125, and a source thereof is connected to the ground terminal 100. The gate and drain of the N-channel transistor 134 are connected to the switching circuit 150, the gate of the N-channel transistor 139 of the differential amplifier circuit 124, and the gate of the N-channel transistor 145 of the differential amplifier circuit 125, and a source thereof is connected to the ground terminal 100.

The switching circuit 150 receives the output of the control circuit 121 as the switching signal.

Next, an operation of the voltage regulator according to the second embodiment is described.

As illustrated in FIG. 3, in the voltage regulator according to the second embodiment, the bias circuit 123 of the voltage regulator according to the first embodiment is replaced with a structure of generating bias currents by current-mirroring in a single bias circuit. As in the case of the first embodiment, with respect to the bias currents, the current supplied from the N-channel transistor 134 to the differential amplifier circuit 125 is set to a value larger than the current supplied from the N-channel transistor 132 to the differential amplifier circuit 125.

When the control circuit 121 takes the first logic value to turn off the switching circuit 150, the N-channel transistor 134 is turned off and the differential amplifier circuit 124 stops operating. In this case, the voltage regulator forms a two-stage structure suitable for low-current consumption operation, which includes the differential amplifier circuit 125 and the output transistor 147. The differential amplifier circuit 125 may operate at with a very small current supplied from the N-channel transistor 132, and hence the current consumption of the voltage regulator may be suppressed to a low value.

In contrast to this, when the control circuit 121 takes the second logic value to turn on the switching circuit 150, the N-channel transistor 134 is turned on and the differential amplifier circuit 124 becomes an operating state. In this state, it may be assumed that the regulator has a three-stage structure including the differential amplifier circuits 124 and 125 and the output transistor 147. Because the regulator has the three-stage structure, a power supply voltage rejection ratio and a transient response characteristic are improved. The sufficient currents are supplied to the differential amplifier circuits 124 and 125, and hence the power supply voltage rejection ratio and the transient response characteristic are significantly improved.

As described above, according to the voltage regulator in the second embodiment, with a small occupied area, automatic switching may be achieved between the two-stage structure operation suitable for low current consumption and the three-stage structure operation by which a high power supply voltage rejection ratio and an excellent transient response characteristic are obtained.

Third Embodiment

Figure 4:
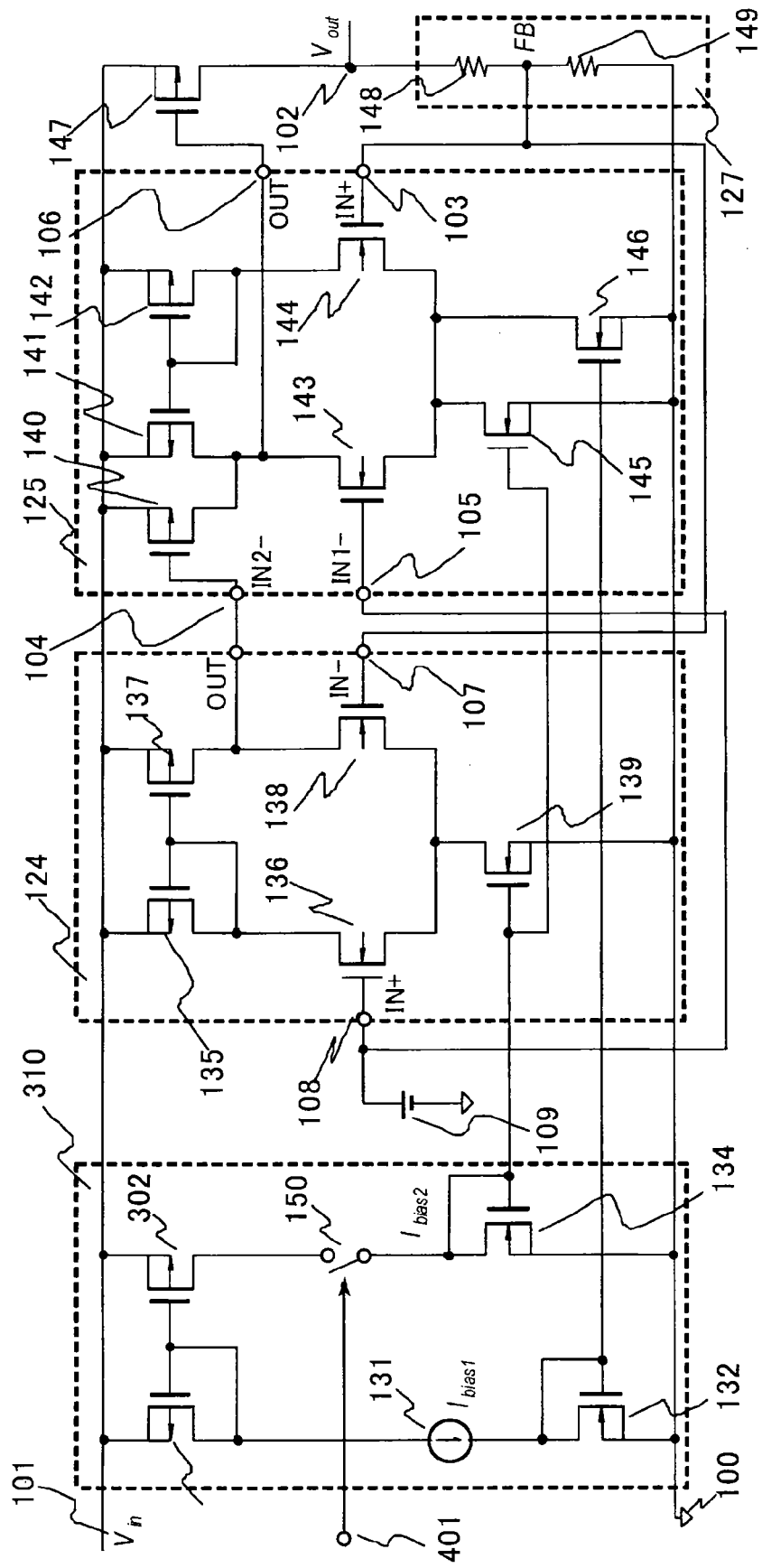
FIG. 4 illustrates a voltage regulator according to a third embodiment of the present invention.
Figure 5:
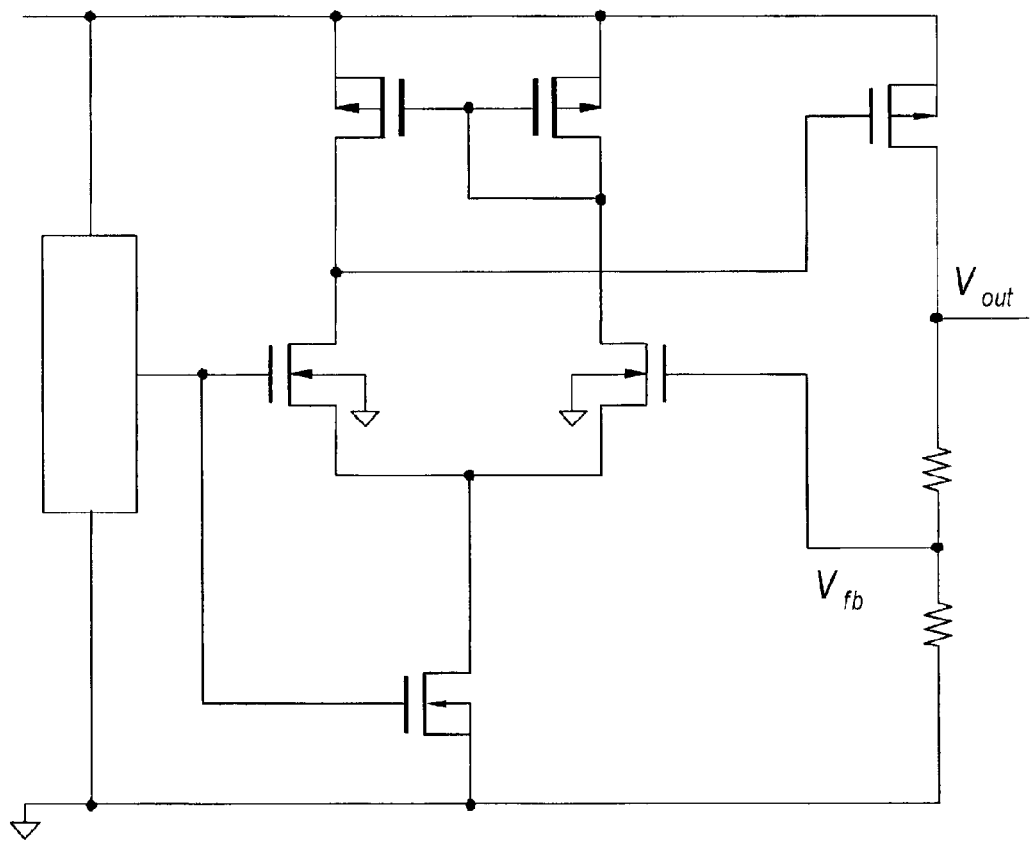
FIG. 5 is a circuit diagram illustrating a conventional voltage regulator.
Figure 6:
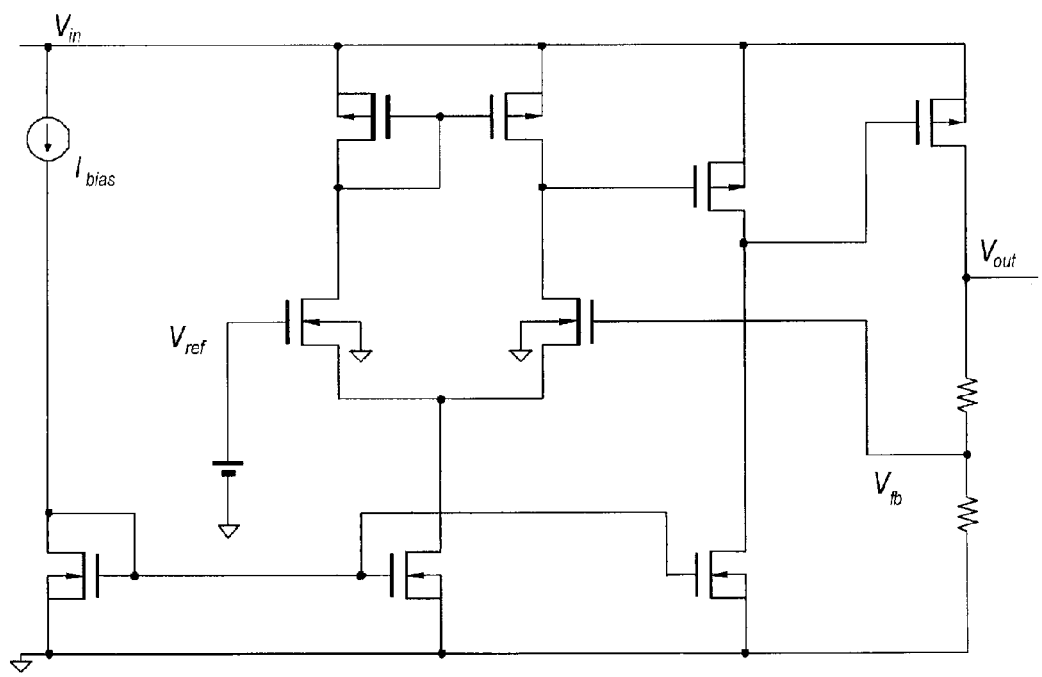
FIG. 6 is a circuit diagram illustrating a conventional voltage regulator.

FIG. 4 is a circuit diagram illustrating a voltage regulator according to a third embodiment of the present invention.

The voltage regulator according to the third embodiment includes the reference voltage circuit 109, the output transistor 147, the voltage dividing circuit 127, the differential amplifier circuits 124 and 125, the bias circuit 310, and an external terminal 401. FIG. 4 is different from FIG. 3 in that the control circuit 121 is removed and the external terminal 401 is provided. The external terminal 401 is connected to the switching circuit 150.

Next, an operation of the voltage regulator according to the third embodiment is described.

A structure in which a signal is input from the external terminal 401 is employed instead of the control circuit 121 used in the voltage regulator according to the second embodiment. Through the input of an "H" or "L" signal from the external terminal 401, manual selection may be achieved between a voltage regulator which has the two-stage structure for the low-current consumption operation and a voltage regulator which has the three-stage structure with an improved power supply voltage rejection ratio and an improved transient response characteristic. Through such manual selection, when a load (current) is light, the two-stage structure operation suitable for low-current consumption is performed, and when a load is heavy, the three-stage structure operation in which currents are sufficiently supplied is performed. Even in the structure illustrated in FIG. 1, when the external terminal 401 is used instead of the control circuit 121 as described above, the operating state may be selected manually.

As described above, according to the voltage regulator in the third embodiment, with a small occupied area, arbitrary switching may be achieved between the two-stage structure operation suitable for low current consumption and the three-stage structure operation by which a high power supply voltage rejection ratio and an excellent transient response characteristic are obtained.

Fourth Embodiment

Figure 7:
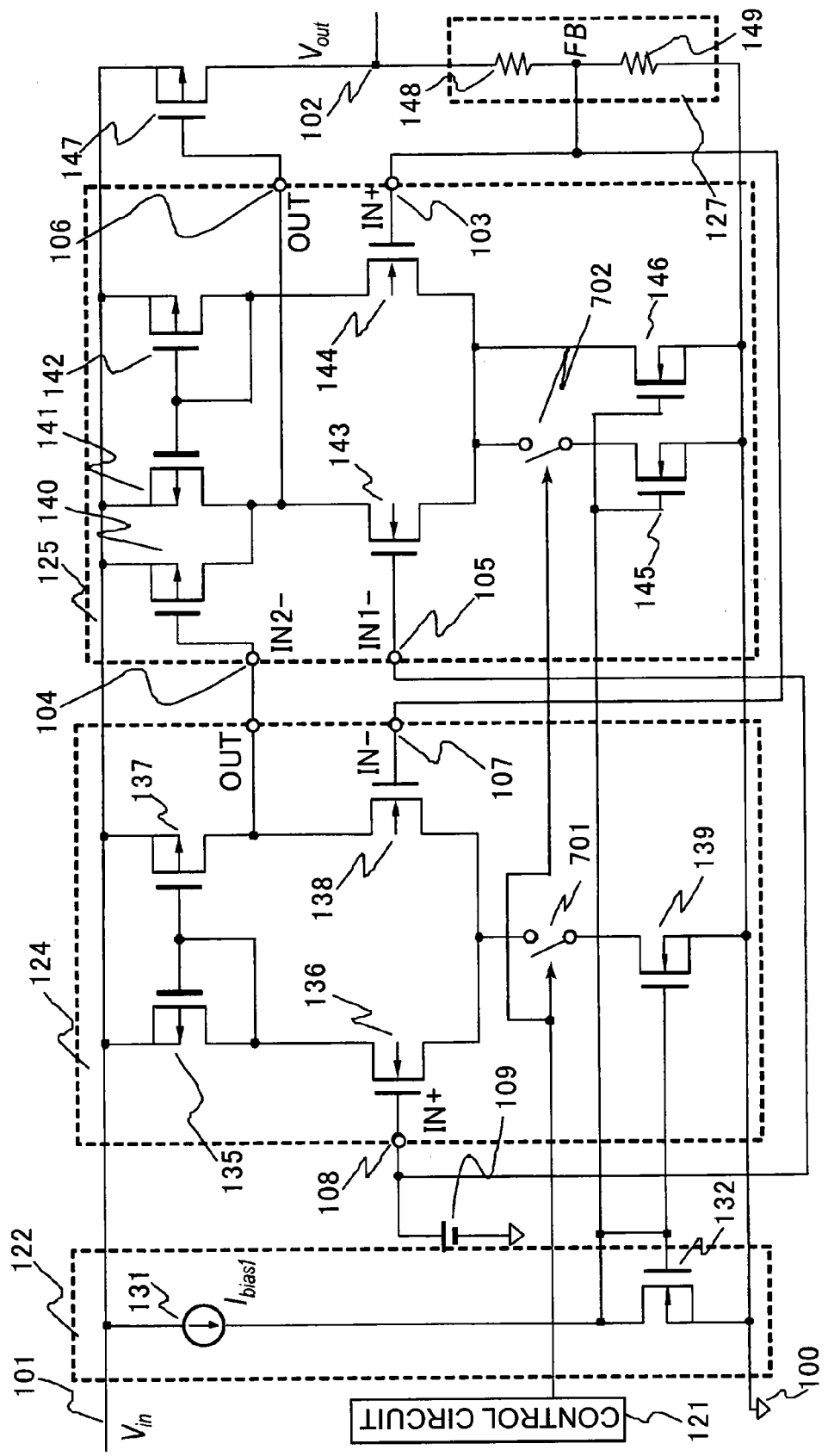
FIG. 7 illustrates a voltage regulator according to a fourth embodiment of the present invention.

FIG. 7 is a circuit diagram illustrating a voltage regulator according to a fourth embodiment of the present invention.

The voltage regulator according to the fourth embodiment includes the reference voltage circuit 109, the output transistor 147, the voltage dividing circuit 127, the differential amplifier circuits 124 and 125, the bias circuit 122, and the control circuit 121. FIG. 7 is different from FIG. 1 in that the bias circuit 123 is removed to use only the bias circuit 122 for the differential amplifier circuits 124 and 125, the differential amplifier circuit 124 further includes a switching circuit 701, and the differential amplifier circuit 125 further includes a switching circuit 702.

The drain of the N-channel transistor 139 is connected to one side of the switching circuit 701. The opposite side of the switching circuit 701 is connected to the sources of the N-channel transistors 136 and 138. The drain of the N-channel transistor 145 is connected to one side of the switching circuit 702. The opposite side of the switching circuit 702 is connected to the sources of the N-channel transistors 143 and 144. The output of the control circuit 121 is supplied as a switching signal to the switching circuits 701 and 702.

Next, an operation of the voltage regulator according to the fourth embodiment is described.

The control circuit 121 has a function of interrupting the currents supplied from the bias circuit 122 based on the control signal. The current supplied from the bias circuit 122 to the differential amplifier circuit 125 through the N-channel transistor 146 is set to a value larger than the current supplied from the bias circuit 122 to the differential amplifier circuit 125 through the N-channel transistor 145.

When the control circuit 121 takes the first logic value to turn off the switching circuits 701 and 702, the differential amplifier circuit 124 stops operating. In this case, the voltage regulator forms a two-stage structure suitable for low-current consumption operation, which includes the differential amplifier circuit 125 and the output transistor 147. The differential amplifier circuit 125 may operate with a very small current supplied only from the N-channel transistor 146, and hence the current consumption of the voltage regulator may be suppressed to a low value. Further, only the bias circuit 122 is used as the bias circuit, and hence the current consumption may be further reduced.

In contrast to this, when the control circuit 121 takes the second logic value to turn on the switching circuits 701 and 702, the differential amplifier circuit 124 becomes an operating state. In this state, it may be assumed that the regulator has a three-stage structure including the differential amplifier circuits 124 and 125 and the output transistor 147. Because the regulator has the three-stage structure, a power supply voltage rejection ratio and a transient response characteristic are improved. The sufficient currents are supplied to the differential amplifier circuits 124 and 125, and hence the power supply voltage rejection ratio and the transient response characteristic are significantly improved. Further, only the bias circuit 122 is used as the bias circuit, and hence the current consumption may be further reduced.

As described above, according to the voltage regulator in the fourth embodiment, the single bias circuit is used, and hence the circuit capable of automatically switching between the two-stage structure operation suitable for low current consumption and the three-stage structure operation by which the high power supply voltage rejection ratio and the excellent transient response characteristic are obtained may be realized with a small occupied area and lower current consumption.

Fifth Embodiment

Figure 8:
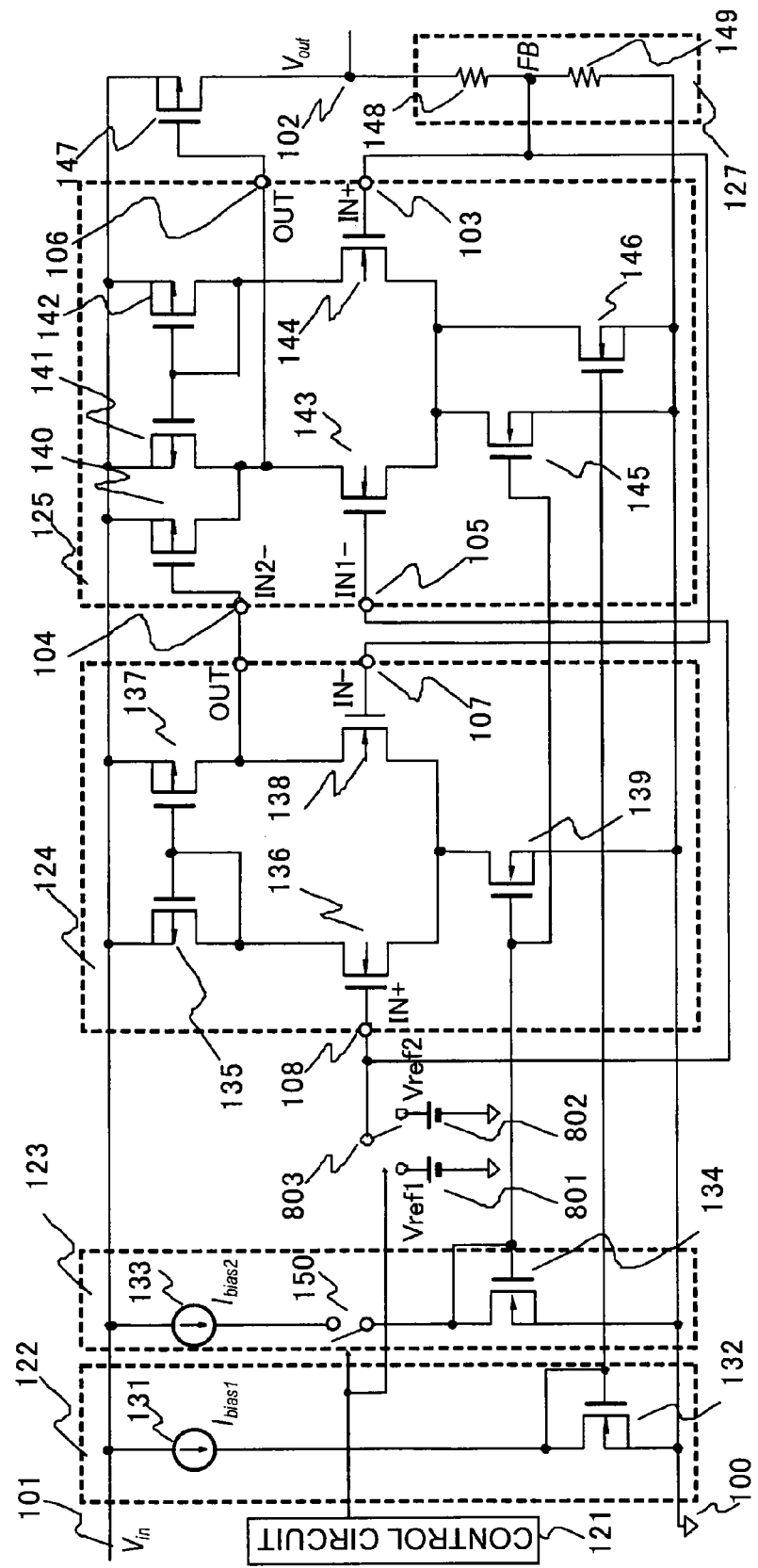
FIG. 8 illustrates a voltage regulator according to a fifth embodiment of the present invention.

FIG. 8 is a circuit diagram illustrating a voltage regulator according to a fifth embodiment of the present invention.

The voltage regulator according to the fifth embodiment includes reference voltage circuits 801 and 802, a switching circuit 803, the output transistor 147, the voltage dividing circuit 127, the differential amplifier circuits 124 and 125, the bias circuits 122 and 123, and the control circuit 121. FIG. 8 is different from FIG. 1 in that the two reference voltage circuits are provided and switched in response to a switching signal from the control circuit.

One side of the switching circuit 803 is connected to the gate of the N-channel transistor 136. The other side of the switching circuit 803 is connected to one of the reference voltage circuits 801 and 802 in response to the switching signal.

Next, an operation of the voltage regulator according to the fifth embodiment is described.

The control circuit 121 has a function of interrupting the currents supplied from the bias circuit 123 based on the control signal and a function of switching between the reference voltage circuits 801 and 802. A voltage of the reference voltage circuit 801 is set to a voltage suitable to cancel an offset generated in the differential amplifier circuit in the case of the two-stage structure. A voltage of the reference voltage circuit 802 is set to a voltage suitable to cancel an offset generated in the differential amplifier circuits in the case of the three-stage structure.

When the control circuit 121 takes the first logic value to turn off the switching circuit 150, the bias circuit 123 and the differential amplifier circuit 124 stop operating, and the reference voltage circuit 801 is connected to the gate of the N-channel transistor 136. In this case, the voltage regulator forms the two-stage structure suitable for low-current consumption operation, which includes the differential amplifier circuit 125 and the output transistor 147. The differential amplifier circuit 125 may operate with a very small current supplied only from the bias circuit 122, and hence the current consumption of the voltage regulator may be suppressed to a low value. The reference voltage circuit 801 is connected to the gate of the N-channel transistor 136, and hence the reference voltage suitable to cancel the offset generated in the differential amplifier circuit in the case of the two-stage structure may be selected. Therefore, the precision of the output voltage is improved.

In contrast to this, when the control circuit 121 takes the second logic value to turn on the switching circuit 150, the bias circuit 123 and the differential amplifier circuit 124 become an operating state, and the reference voltage circuit 802 is connected to the gate of the N-channel transistor 136. In this state, it may be assumed that the regulator has the three-stage structure including the differential amplifier circuits 124 and 125 and the output transistor 147. Because the regulator has the three-stage structure, the power supply voltage rejection ratio and the transient response characteristic are significantly improved. The reference voltage circuit 802 is connected to the gate of the N-channel transistor 136, and hence the reference voltage suitable to cancel the offset generated in the differential amplifier circuits in the case of the three-stage structure may be selected. Therefore, the precision of the output voltage is improved.

As described above, according to the voltage regulator in the fifth embodiment, in the circuit with a small occupied area capable of automatically switching between the two-stage structure operation suitable for low current consumption and the three-stage structure operation by which the high power supply voltage rejection ratio and the excellent transient response characteristic are obtained, a fluctuation in output voltage due to the offset may be eliminated to achieve high-precision output.

Sixth Embodiment

Figure 9:
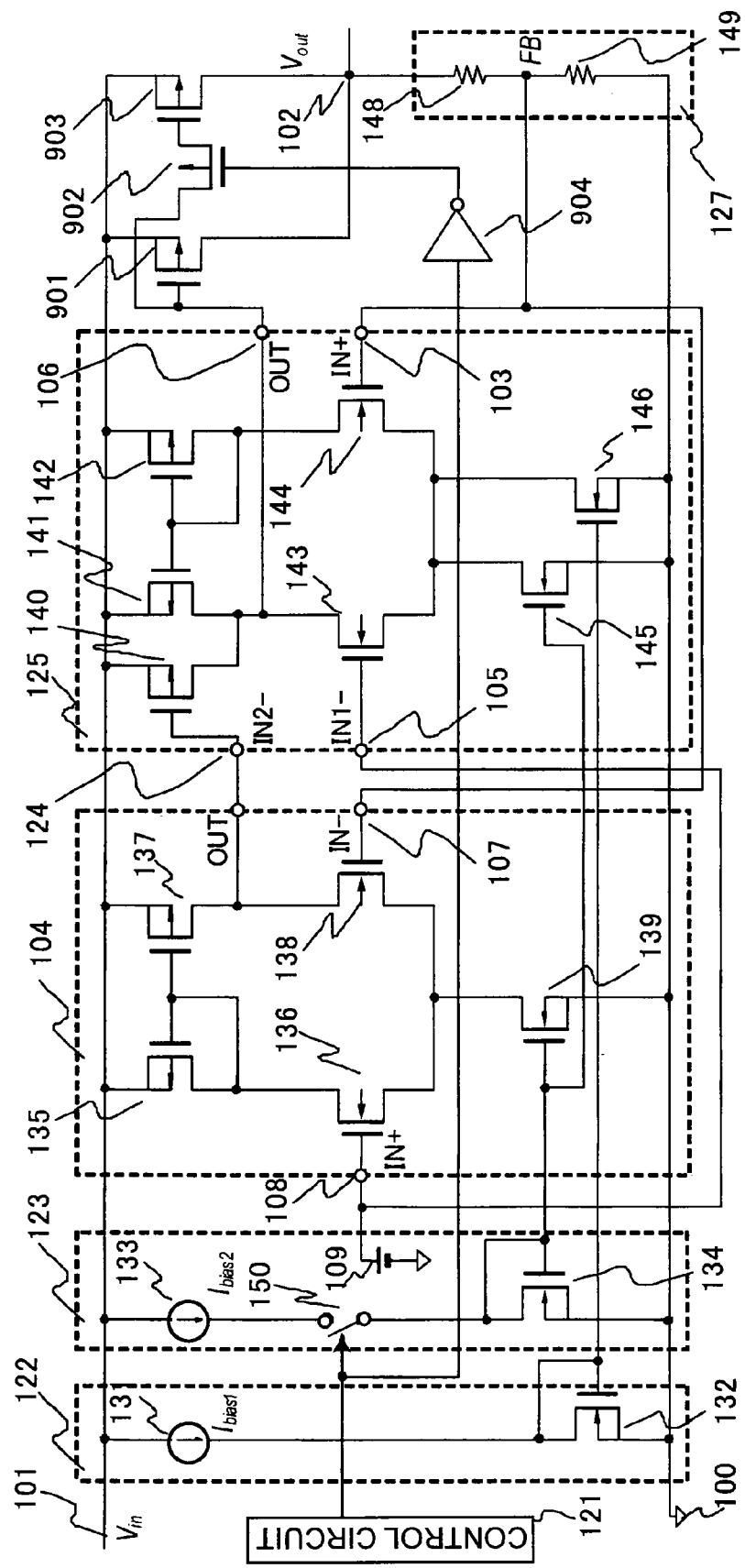
FIG. 9 illustrates a voltage regulator according to a sixth embodiment of the present invention.

FIG. 9 is a circuit diagram illustrating a voltage regulator according to a sixth embodiment of the present invention.

The voltage regulator according to the sixth embodiment includes the reference voltage circuit 109, output transistors 901 and 903, a P-channel transistor 902, an inverter 904, the voltage dividing circuit 127, the differential amplifier circuits 124 and 125, the bias circuits 122 and 123, and the control circuit 121. FIG. 9 is different from FIG. 1 in that the two output transistors are provided and an output transistor size is switched in response to a signal from the control circuit.

A gate of the output transistor 901 is connected to the output terminal 106 of the differential amplifier circuit 125, a drain thereof is connected to the output terminal 102, and a source thereof is connected to the power supply terminal 101. A gate of the output transistor 903 is connected to a source of the P-channel transistor 902, a drain thereof is connected to the output terminal 102, and a source thereof is connected to the power supply terminal 101. A gate of the P-channel transistor 902 is connected to an output terminal of the inverter 904 and a drain thereof is connected to the output terminal 106 of the differential amplifier circuit 125. An input terminal of the inverter 904 is connected to an output terminal of the control circuit 121.

Next, an operation of the voltage regulator according to the sixth embodiment is described.

A current supplied from the output transistor 903 is set to a value larger than a current supplied from the output transistor 901.

When the control circuit 121 takes the first logic value to turn off the switching circuit 150, the bias circuit 123 and the differential amplifier circuit 124 stop operating, and the output transistor 903 is turned off. In this case, the voltage regulator forms the two-stage structure suitable for low-current consumption operation, which includes the differential amplifier circuit 125 and the output transistor 901. The differential amplifier circuit 125 may operate with a very small current supplied only from the bias circuit 122, and hence the current consumption of the voltage regulator may be suppressed to a low value. Only the output transistor 901 operates, and hence the output transistor suitable for the differential amplifier circuit operating with a very small current in the case of the two-stage structure may be selected.

In contrast to this, when the control circuit 121 takes the second logic value to turn on the switching circuit 150, the bias circuit 123 and the differential amplifier circuit 124 become an operating state, and the output transistor 903 is turned on. In this state, it may be assumed that the regulator has the three-stage structure including the differential amplifier circuits 124 and 125 and the output transistors 901 and 903. Because the regulator has the three-stage structure, the power supply voltage rejection ratio and the transient response characteristic are significantly improved. Only the output transistors 901 and 903 operate, and hence the output transistors suitable for the regulator having the three-stage structure may be selected.

As described above, according to the voltage regulator in the sixth embodiment, in the circuit which has a small occupied area and is capable of automatically switching between the two-stage structure operation suitable for low current consumption and the three-stage structure operation by which the high power supply voltage rejection ratio and the excellent transient response characteristic are obtained, the output transistor suitable for each of the two-stage structure operation and the three-stage structure operation may be selected.

Seventh Embodiment

Figure 10:
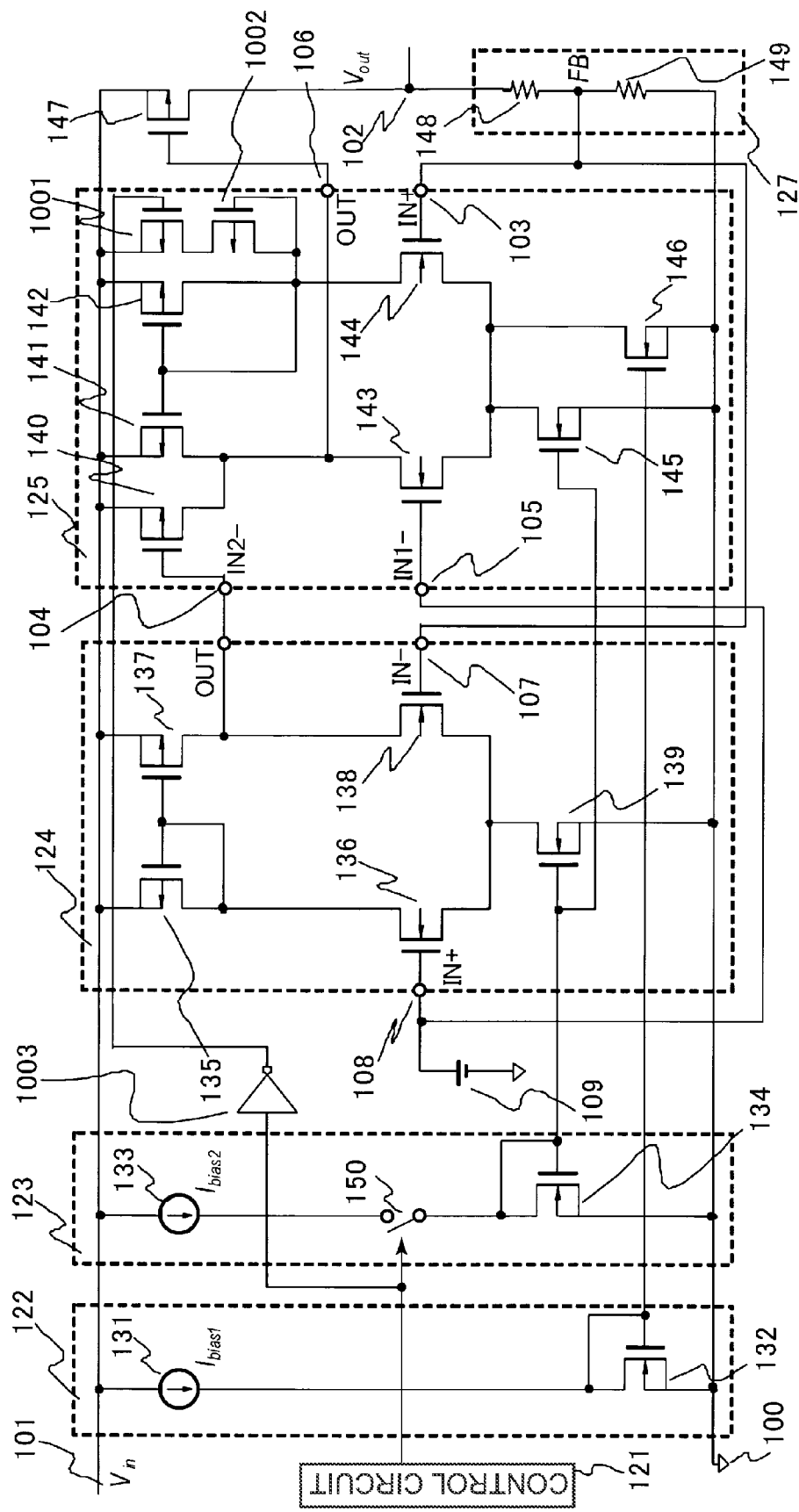
FIG. 10 illustrates a voltage regulator according to a seventh embodiment of the present invention.

FIG. 10 is a circuit diagram illustrating a voltage regulator according to a seventh embodiment of the present invention.

The voltage regulator according to the seventh embodiment includes the reference voltage circuit 109, the output transistor 147, the voltage dividing circuit 127, the differential amplifier circuits 124 and 125, the bias circuits 122 and 123, an inverter 1003, and the control circuit 121. FIG. 10 is different from FIG. 1 in that the differential amplifier circuit 125 further includes P-channel transistors 1001 and 1002, and the inverter 1003 is provided.

A gate of the P-channel transistor 1001 is connected to an output terminal of the inverter 1003, a drain thereof is connected to a source of the P-channel transistor 1002, and a source thereof is connected to the power supply terminal 101. A gate and drain of the P-channel transistor 1002 are connected to the gate of the P-channel transistor 142. An input terminal of the inverter 1003 is connected to the output terminal of the control circuit 121 and the output terminal of the inverter 1003 is connected to the gate of the P-channel transistor 1001.

Next, an operation of the voltage regulator according to the seventh embodiment is described.

The P-channel transistor 1002 is equal in size to the P-channel transistors 140, 141, and 142.

When the control circuit 121 takes the second logic value to turn on the switching circuit 150 and the P-channel transistor 1001, the bias circuit 123, the differential amplifier circuit 124, and the P-channel transistor 1002 become an operating state. In this state, it may be assumed that the regulator has the three-stage structure including the differential amplifier circuits 124 and 125 and the output transistor 147. Therefore, because the P-channel transistors 140 and 1002 are in the operating state, an offset generated in a current mirror including the P-channel transistors 141 and 142 may be reduced. Thus, an offset generated in the differential amplifier circuit 125 may be reduced.

As described above, according to the voltage regulator in the seventh embodiment, the P-channel transistor 1002 is allowed to operate by automatically switching the P-channel transistor 1001 by the circuit which has a small occupied area and is capable of automatically switching between the two-stage structure operation suitable for low current consumption and the three-stage structure operation by which the high power supply voltage rejection ratio and the excellent transient response characteristic are obtained. Thus, the offset generated in the differential amplifier circuit 125 may be reduced.

Eighth Embodiment

Figure 11:
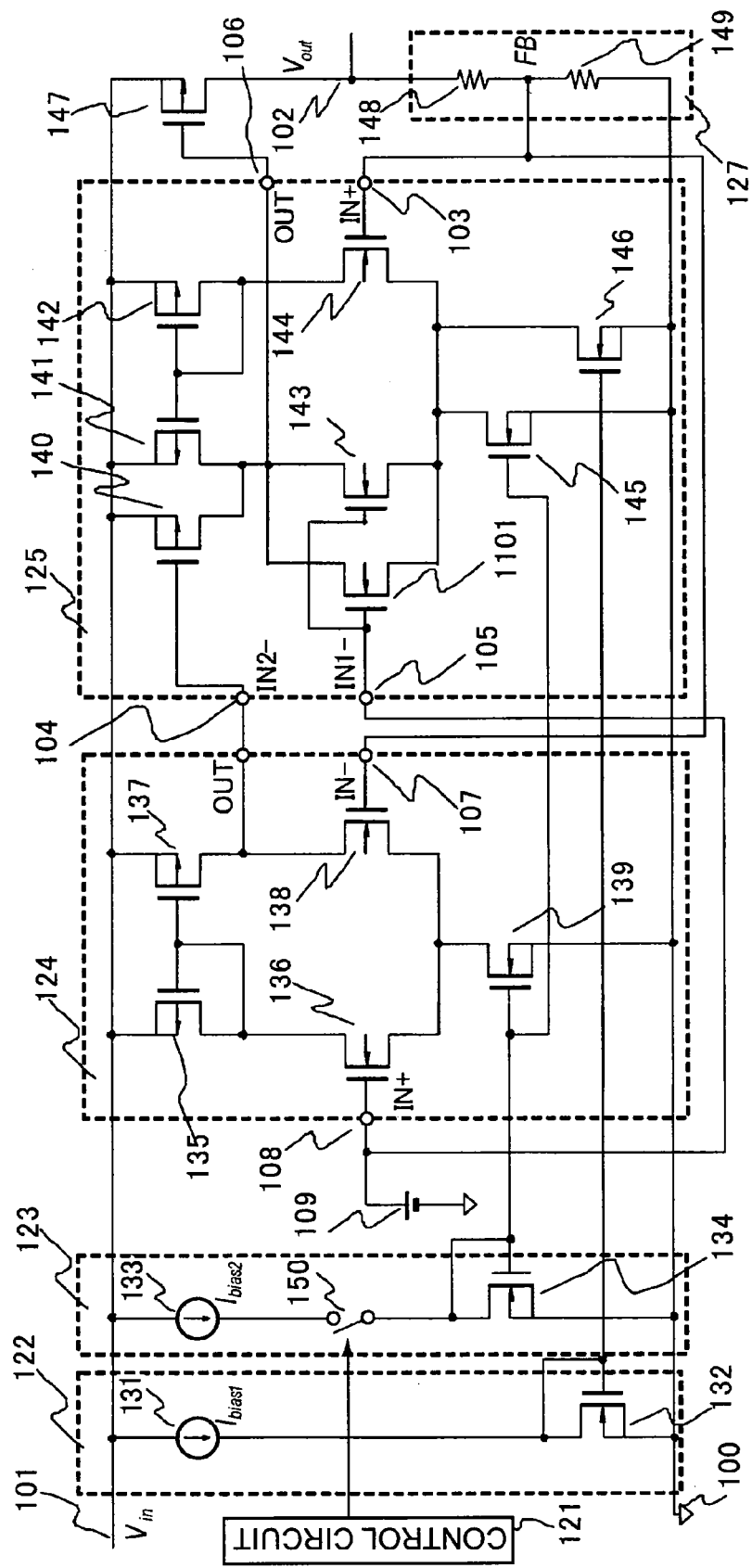
FIG. 11 illustrates a voltage regulator according to an eighth embodiment of the present invention.

FIG. 11 is a circuit diagram illustrating a voltage regulator according to an eighth embodiment of the present invention.

The voltage regulator according to the eighth embodiment includes the reference voltage circuit 109, the output transistor 147, the voltage dividing circuit 127, the differential amplifier circuits 124 and 125, the bias circuits 122 and 123, and the control circuit 121. FIG. 11 is different from FIG. 1 in that the differential amplifier circuit 125 further includes an N-channel transistor 1101.

A gate of the N-channel transistor 1101 is connected to the inverting input terminal 105 of the differential amplifier circuit 125, a drain thereof is connected to the drain of the N-channel transistor 143, and a source thereof is connected to the source of the N-channel transistor 143.

Next, an operation of the voltage regulator according to the eighth embodiment is described.

When the control circuit 121 takes the second logic value to turn on the switching circuit 150, the bias circuit 123 and the differential amplifier circuit 124 become the operating state. In this state, it may be assumed that the regulator has the three-stage structure including the differential amplifier circuits 124 and 125 and the output transistor 147. The N-channel transistor 1101 is allowed to operate simultaneously with the N-channel transistor 143, and hence an offset generated in the differential amplifier circuit 125 may be reduced.

As described above, according to the voltage regulator in the eighth embodiment, the N-channel transistor 1101 is allowed to operate simultaneously with the N-channel transistor 143 by the circuit which has a small occupied area and is capable of automatically switching between the two-stage structure operation suitable for low current consumption and the three-stage structure operation by which the high power supply voltage rejection ratio and the excellent transient response characteristic are obtained. Thus, the offset generated in the differential amplifier circuit 125 may be reduced.

Ninth Embodiment

Figure 12:
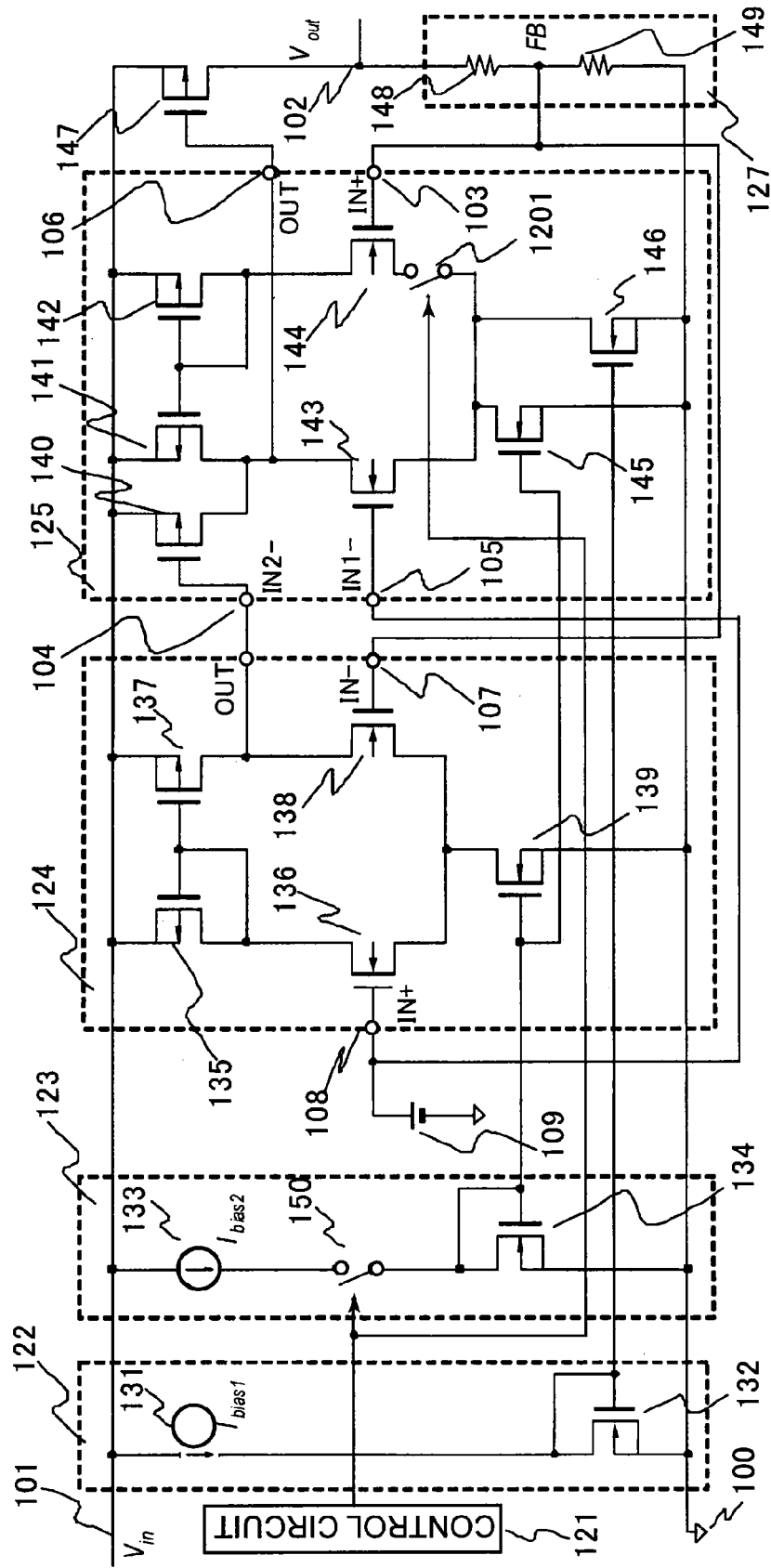
FIG. 12 illustrates a voltage regulator according to a ninth embodiment of the present invention.

FIG. 12 is a circuit diagram illustrating a voltage regulator according to a ninth embodiment of the present invention.

The voltage regulator according to the ninth embodiment includes the reference voltage circuit 109, the output transistor 147, the voltage dividing circuit 127, the differential amplifier circuits 124 and 125, the bias circuits 122 and 123, and the control circuit 121. FIG. 12 is different from FIG. 1 in that the differential amplifier circuit 125 further includes a switching circuit 1201.

One side of the switching circuit 1201 is connected to the source of the N-channel transistor 144 and the other side thereof is connected to the drain of the N-channel transistor 146. The switching circuit 1201 receives an output of the control circuit 121 as a switching signal.

Next, an operation of the voltage regulator according to the ninth embodiment is described.

When the control circuit 121 takes the second logic value to turn on the switching circuit 150, the bias circuit 123 and the differential amplifier circuit 124 become the operating state and the switching circuit 1201 becomes an off state. In such a state, it may be assumed that the regulator has the three-stage structure including the differential amplifier circuits 124 and 125 and the output transistor 147. The switching circuit 1201 is in the off state, and hence the N-channel transistors 141, 142, and 144 may be turned off to reduce current consumption.

As described above, according to the voltage regulator in the ninth embodiment, in the circuit which has a small occupied area and is capable of automatically switching between the two-stage structure operation suitable for low current consumption and the three-stage structure operation by which the high power supply voltage rejection ratio and the excellent transient response characteristic are obtained, the switching circuit 1201 is turned off during the three-stage structure operation, to thereby reduce current consumption.

Tenth Embodiment

Figure 13:
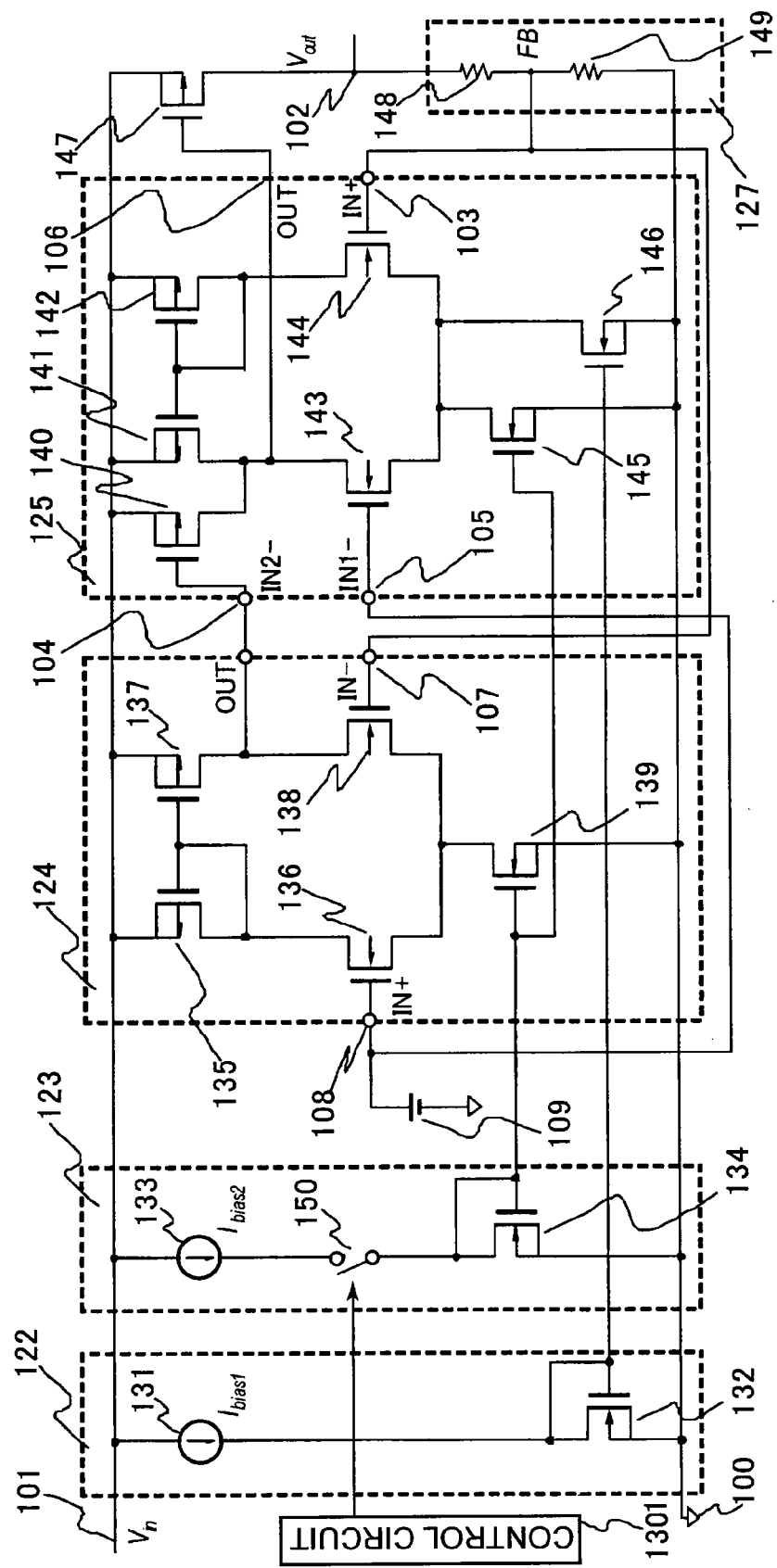
FIG. 13 illustrates a voltage regulator according to a tenth embodiment of the present invention.

FIG. 13 is a circuit diagram illustrating a voltage regulator according to a tenth embodiment of the present invention.

The voltage regulator according to the tenth embodiment includes the reference voltage circuit 109, the output transistor 147, the voltage dividing circuit 127, the differential amplifier circuits 124 and 125, the bias circuits 122 and 123, and a control circuit 1301. FIG. 13 is different from FIG. 1 in that the control circuit is changed.

Figure 14:
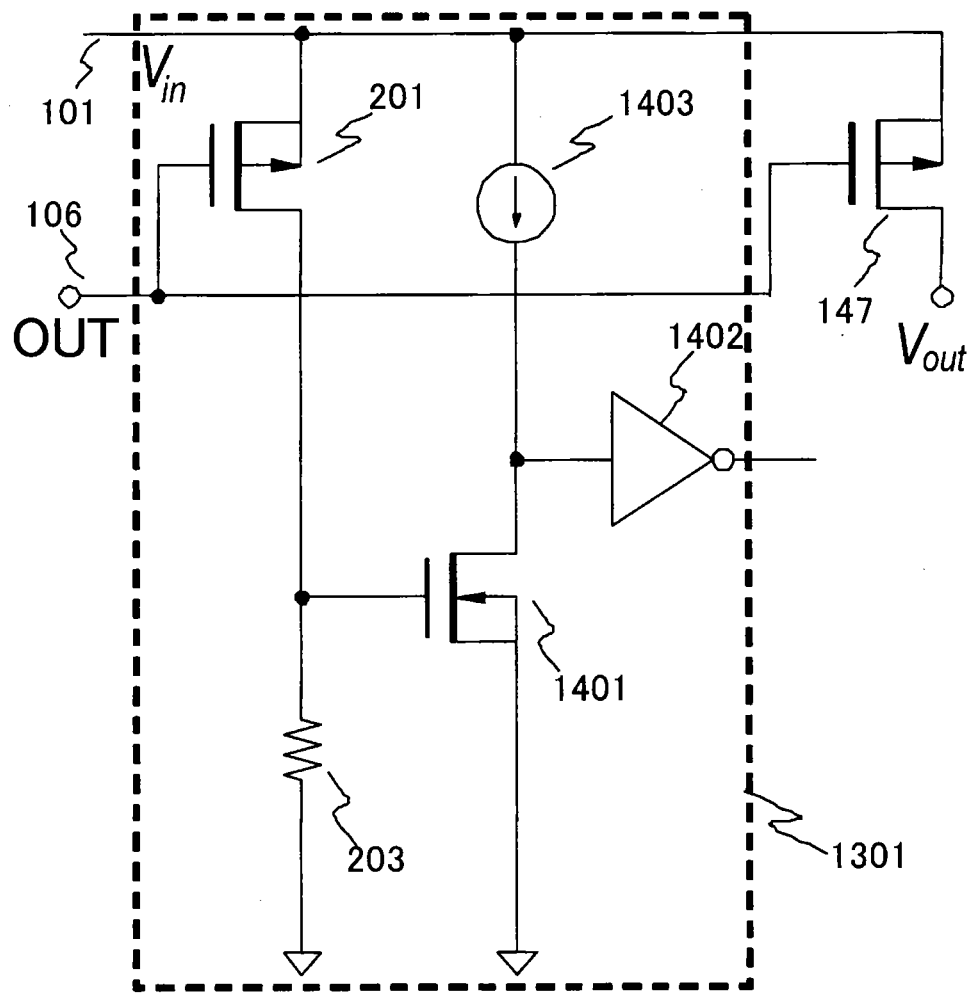
FIG. 14 illustrates a control circuit of the voltage regulator according to the tenth embodiment of the present invention.

FIG. 14 is a circuit diagram illustrating the control circuit 1301. The connection of the control circuit 1301 is described.

The P-channel transistor 201 includes the gate connected to the output terminal 106 of the differential amplifier circuit 125, the drain connected to the one side of the resistor 203, and the source connected to the power supply terminal 101. The opposite side of the resistor 203 is connected to the ground terminal 100. An N-channel transistor 1401 includes a gate connected to the one side of the resistor 203, a drain connected to an input terminal of an inverter 1402 and a bias circuit 1403, and a source connected to the ground terminal 100. The input terminal of the inverter 1402 is connected to the bias circuit 1403. An output of the inverter 1402 is supplied as a switching signal to the switching circuit 150.

Next, an operation of the control circuit of the voltage regulator according to the tenth embodiment is described.

The control circuit 1301 has a function of suspending the bias circuit 123 based on a control signal. As illustrated in FIG. 14, the P-channel transistor 201 is connected in parallel to the output transistor 147, and a current Iout flowing through the output transistor 147 is caused to flow into the resistor 203, to thereby obtain a voltage Vdet proportional to an output current.

Assume that the output transistor 147 and the P-channel transistor 201 are of the same type, an aspect ratio is set to M:1, and a resistance value of the resistor 203 is denoted by R. In this case, the voltage Vdet is expressed by Expression (1).

$$Vdet = Iout \cdot R/M \quad (1)$$

Assume that Vth indicates a threshold voltage of the N-channel transistor 1401. In this case, a condition in which the output of the inverter 1402 is in an "H" level is expressed by Expression (2).

$$Iout \cdot R/M > Vth \quad (2)$$

Assume that the output of the inverter 1402 is the control signal of the control circuit 1301, an "L" level indicates a first logic value, and the "H" level indicates a second logic value. When the control signal is used, the switching circuit 150 may be switched based on the load current. The control circuit 1301 does not use a comparator, and hence a low-current consumption operation may be achieved with a small occupied area.

As described above, according to the voltage regulator in the tenth embodiment, the control circuit 1301 does not use a comparator in the circuit which has a small occupied area and is capable of automatically switching between the two-stage structure operation suitable for low current consumption and the three-stage structure operation by which the high power supply voltage rejection ratio and the excellent transient response characteristic are obtained. Therefore, the low-current consumption operation may be achieved with the small occupied area.

Eleventh Embodiment

Figure 15:
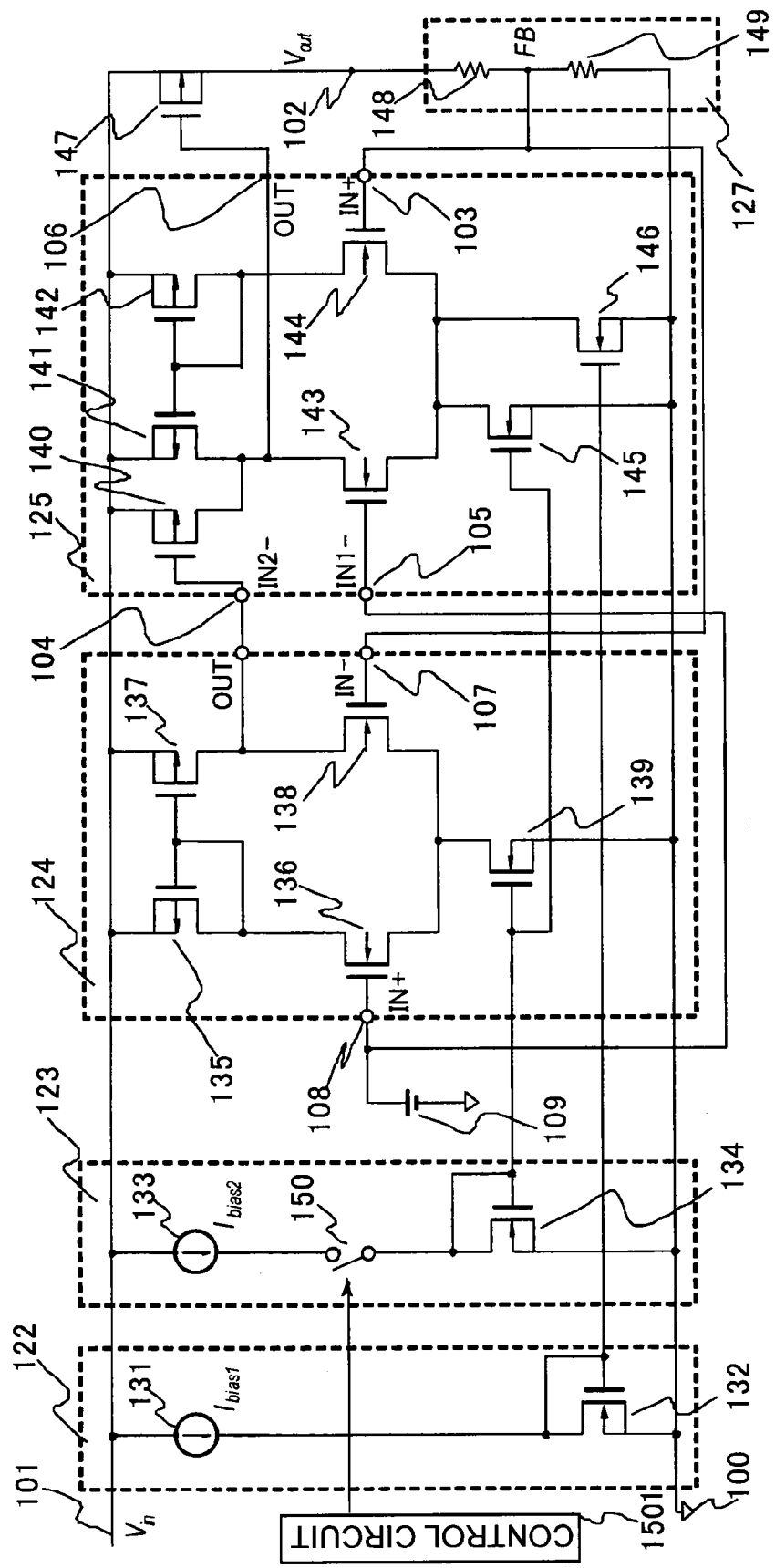
FIG. 15 illustrates a voltage regulator according to an eleventh embodiment of the present invention.

FIG. 15 is a circuit diagram illustrating a voltage regulator according to an eleventh embodiment of the present invention.

The voltage regulator according to the eleventh embodiment includes the reference voltage circuit 109, the output transistor 147, the voltage dividing circuit 127, the differential amplifier circuits 124 and 125, the bias circuits 122 and 123, and a control circuit 1501. FIG. 15 is different from FIG. 1 in that the control circuit is changed.

Figure 16:
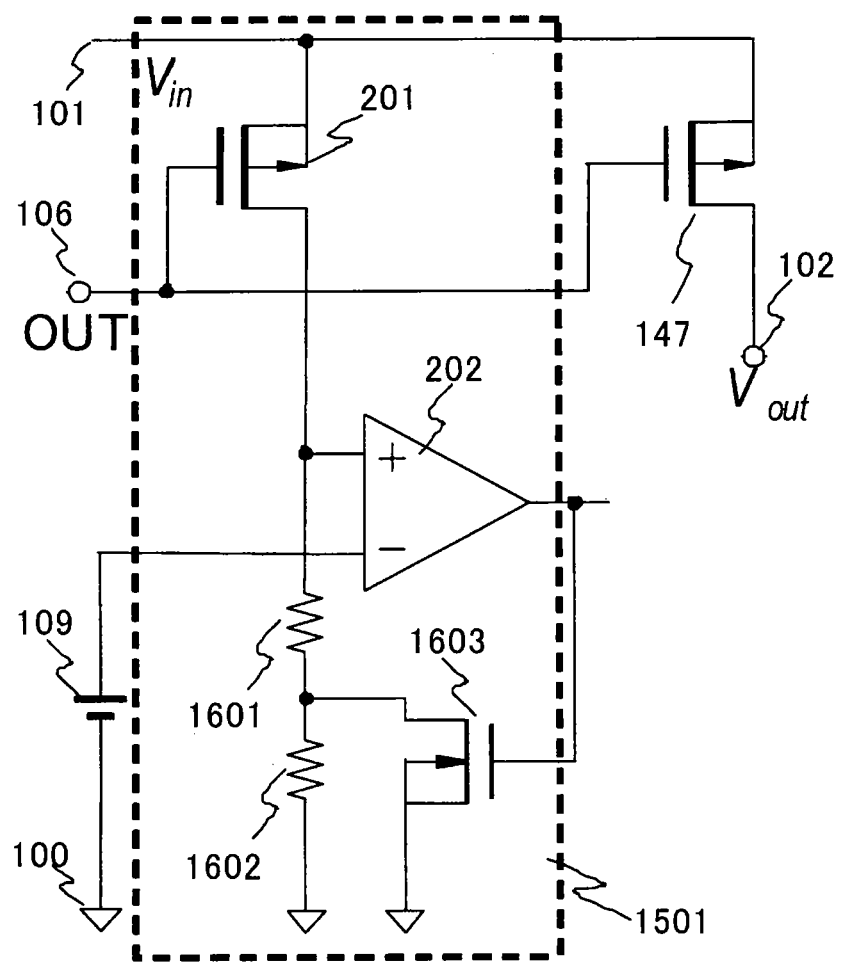
FIG. 16 illustrates a control circuit of the voltage regulator according to the eleventh embodiment of the present invention.

FIG. 16 is a circuit diagram illustrating the control circuit 1501. The connection of the control circuit 1501 is described.

The P-channel transistor 201 includes the gate connected to the output terminal 106 of the differential amplifier circuit 125, the drain connected to one side of a resistor 1601 and the non-inverting input terminal of the comparator 202, and the source connected to the power supply terminal 101. The opposite side of the resistor 1601 is connected to one side of a resistor 1602. The opposite side of the resistor 1602 is connected to the ground terminal 100. The inverting input terminal of the comparator 202 is connected to the reference voltage circuit 109. The output of the comparator 202 is supplied as the switching signal to the switching circuit 150. An N-channel transistor 1603 includes a gate connected to the output terminal of the comparator 202, a drain connected to a connection point between the resistors 1601 and 1602, and a source connected to the ground terminal 100.

Next, an operation of the control circuit of the voltage regulator according to the eleventh embodiment is described.

The control circuit 1501 has a function of suspending the bias circuit 123 based on a control signal. As illustrated in FIG. 16, the P-channel transistor 201 is connected in parallel to the output transistor 147, and a current proportional to the current Tout flowing through the output transistor 147 is caused to flow into the resistors 1601 and 1602, to thereby obtain a detection voltage Vdet proportional to the current Iout.

Assume that the output transistor 147 and the P-channel transistor 201 are of the same type, an aspect ratio is set to M:1, and a resistance value of the resistor 1601 and a resistance value of the resistor 1602 are denoted by R1 and R2, respectively. In this case, a detection voltage Vdet1 during an increase in Iout is expressed by Expression (4).

$$Vdet1 = Iout \cdot (R1+R2)/M \quad (4)$$

A detection voltage Vdet2 during a reduction in Iout is expressed by Expression (5) because the N-channel transistor 1603 is in the on state.

$$Vdet2 = Iout \cdot R1/M \quad (5)$$

As is apparent from Expressions (4) and (5), a hysteresis voltage is generated between during the increase and reduction in Iout.

The reference voltage circuit 109 supplies a voltage Vref to the inverting input terminal of the comparator 202. In this case, a condition in which the output of the comparator 202 is in an "H" level is expressed by Expression (6).

$$Iout \cdot (R1+R2)/M > Vref \quad (6)$$

Further, a condition in which the output of the comparator 202 is in an "L" level is expressed by Expression (7).

$$Iout \cdot R1/M < Vref \quad (7)$$

Assume that the output of the comparator 202 is the control signal of the control circuit 1501, the "L" level indicates the first logic value, and the "H" level indicates the second logic value. When the control signal is used, the switching circuit 150 may be switched based on the load current. There is a difference between the conditions in which the output of the comparator 202 is inverted, and hence a voltage close to the detection voltage may be stably output.

As described above, according to the voltage regulator in the eleventh embodiment, in the circuit which has a small occupied area and is capable of automatically switching between the two-stage structure operation suitable for low current consumption and the three-stage structure operation by which the high power supply voltage rejection ratio and the excellent transient response characteristic are obtained, the control circuit 1501 has the hysteresis of the detection voltage, and hence the voltage close to the detection voltage may be stably output.

Twelfth Embodiment

Figure 17:
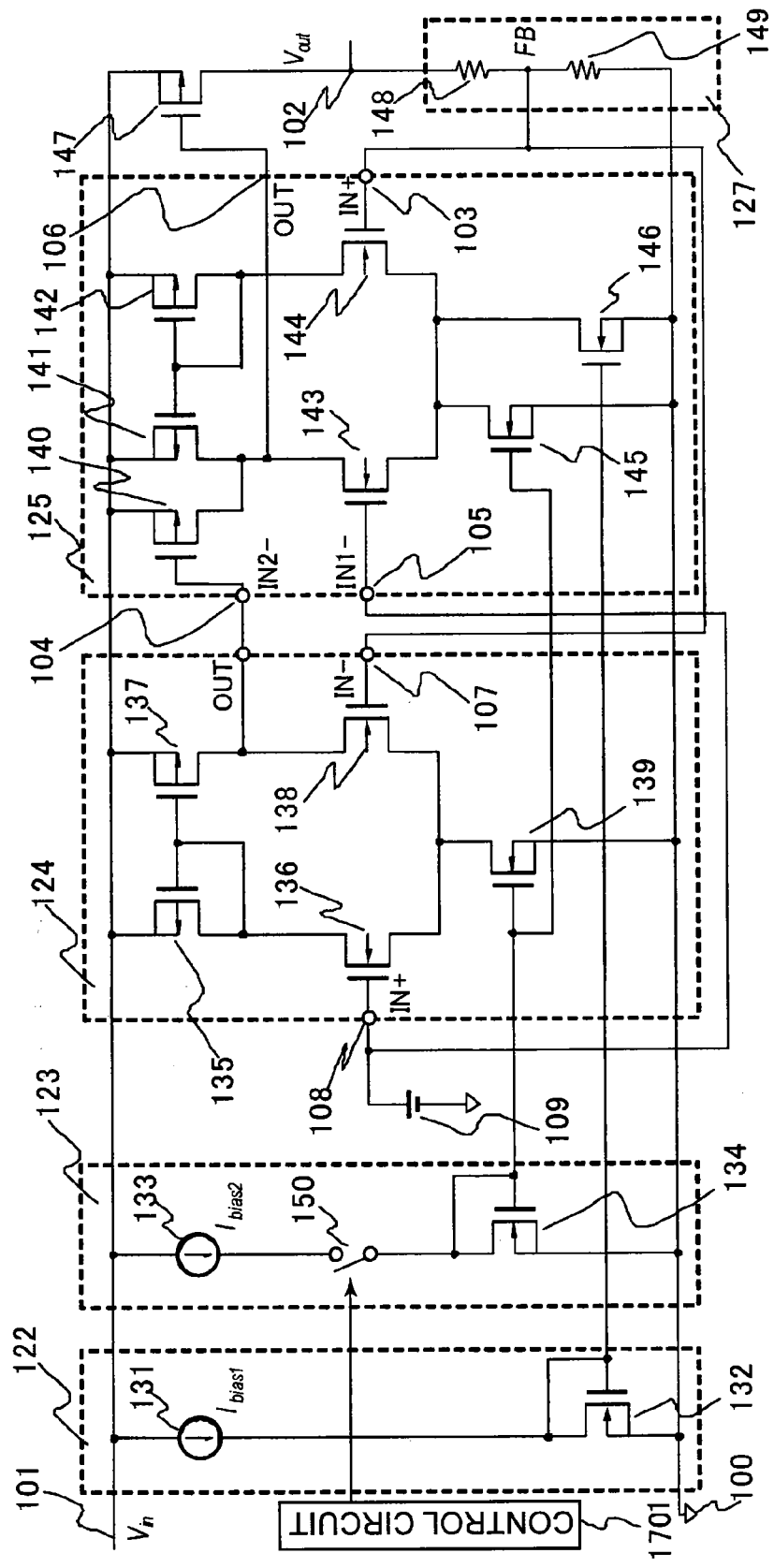
FIG. 17 illustrates a voltage regulator according to a twelfth embodiment of the present invention.

FIG. 17 is a circuit diagram illustrating a voltage regulator according to a twelfth embodiment of the present invention.

The voltage regulator according to the twelfth embodiment includes the reference voltage circuit 109, the output transistor 147, the voltage dividing circuit 127, the differential amplifier circuits 124 and 125, the bias circuits 122 and 123, and a control circuit 1701. FIG. 17 is different from FIG. 1 in that the control circuit is changed.

Figure 18:
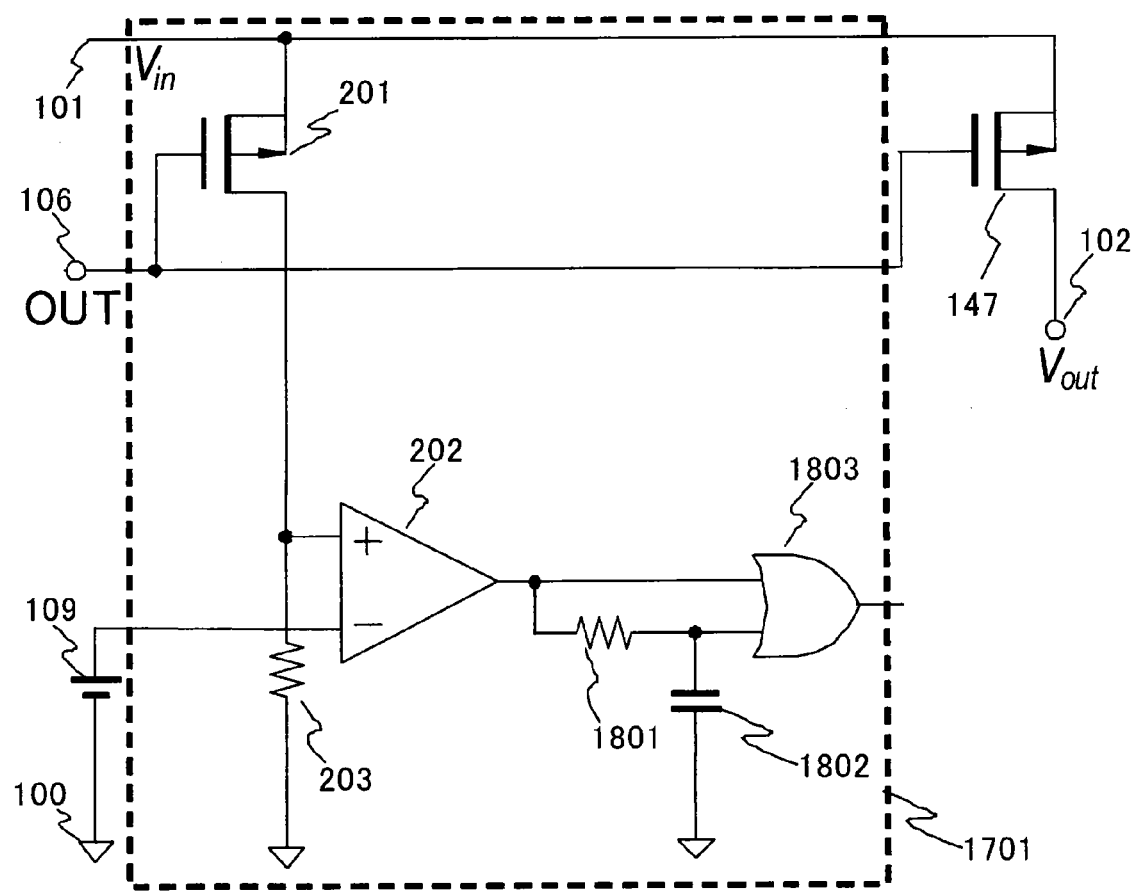
FIG. 18 illustrates a control circuit of the voltage regulator according to the twelfth embodiment of the present invention.

FIG. 18 is a circuit diagram illustrating the control circuit 1701. The connection of the control circuit 1701 is described.

The P-channel transistor 201 includes the gate connected to the output terminal 106 of the differential amplifier circuit 125, the drain connected to the one side of the resistor 203 and the non-inverting input terminal of the comparator 202, and the source connected to the power supply terminal 101. The opposite side of the resistor 203 is connected to the ground terminal 100. The inverting input terminal of the comparator 202 is connected to the reference voltage circuit 109. The output terminal of the comparator 202 is connected to a first input terminal of an OR circuit 1803 and one end of a resistor 1801. A second input terminal of the OR circuit 1803 is connected to the other end of the resistor 1801 and an end of a capacitor 1802. The output of the OR circuit 1803 is supplied as a switching signal to the switching circuit 150.

Next, an operation of the control circuit of the voltage regulator according to the twelfth embodiment is described.

The control circuit 1701 has a function of suspending the bias circuit 123 based on a control signal. As illustrated in FIG. 18, the P-channel transistor 201 is connected in parallel to the output transistor 147, and a current proportional to the current Iout flowing through the output transistor 147 is caused to flow into the resistor 203, to thereby obtain a voltage Vdet proportional to the current Iout.

Assume that the output transistor 147 and the P-channel transistor 201 are of the same type, an aspect ratio is set to M:1, and a resistance value of the resistor 203 is denoted by R. In this case, the voltage Vdet is expressed by Expression (1).

The reference voltage circuit 109 supplies a voltage Vref to the inverting input terminal of the comparator 202. In this case, a condition in which the output of the comparator 202 is in an "H" level is expressed by Expression (2).

When the output of the comparator is inverted from the "H" level to the "L" level, the output of the OR circuit 1803 is generated with a delay time by the resistor 1801 and the capacitor 1802. Therefore, the output voltage of the OR circuit 1803 which is close to the voltage Vdet may be stably generated. Assume that the output of the OR circuit 1803 is the control signal of the control circuit 1701, the "L" level indicates the first logic value, and the "H" level indicates the second logic value. When the control signal is used, the switching circuit 150 may be switched based on the load current.

As described above, according to the voltage regulator in the twelfth embodiment, in the circuit which has a small occupied area and is capable of automatically switching between the two-stage structure operation suitable for low current consumption and the three-stage structure operation by which the high power supply voltage rejection ratio and the excellent transient response characteristic are obtained, the control circuit 1701 has the delay time, and hence the voltage close to the voltage Vdet may be stably output.

What is claimed is:

1. A voltage regulator, comprising:
   a reference voltage circuit connected between a power supply input terminal and a ground terminal, for generating a reference voltage which is constant, independently of a power supply input;
   an output transistor connected between the power supply input terminal and an output voltage terminal, for generating an output voltage which is constant, independently of an output current;
   a voltage dividing circuit connected between the output voltage terminal and the ground terminal, for dividing the output voltage to generate a referred voltage;
   a first differential amplifier circuit for generating a first differential amplifier output voltage based on the reference voltage received as a non-inverting input and the referred voltage received as an inverting input;
   a second differential amplifier circuit for controlling a control terminal of the output transistor based on the output voltage, the referred voltage received as a non-inverting input, the reference voltage received as a first inverting input, and the first differential amplifier output voltage received as a second inverting input;
   at least one bias circuit for supplying a bias current to the first differential amplifier circuit and the second differential amplifier circuit; and
   a control circuit for controlling the first differential amplifier circuit and the second differential amplifier circuit based on an operation control signal having at least a binary value such that the voltage regulator is operable to switch between a two-stage structure operation for low current consumption and a three-stage structure operation for high transient response characteristic,
   wherein when the operation control signal has a first logic value, the first differential amplifier circuit is in a suspended state, thereby switching the voltage regulator to the two-stage structure operation with the second differential amplifier and the output transistor; and
   wherein when the operation control signal has a second logic value, the first differential amplifier circuit is in an operating state, thereby switching the voltage regulator to the three-stage structure operation with the first differential amplifier, the second differential amplifier and the output transistor.

2. The voltage regulator according to claim 1, wherein the control circuit further comprises a current detection circuit for detecting whether or not the output current is equal to or larger than a predetermined value to change a logic value of the output signal,
   wherein the operation control signal comprises an output signal of the current detection circuit.

3. The voltage regulator according to claim 1, wherein the operation control signal is set from an outside of the voltage regulator.

4. The voltage regulator according to claim 1,
   wherein the at least one bias circuit comprises:
      a first bias circuit for supplying a current to the first differential amplifier circuit and the second differential amplifier circuit; and
      a second bias circuit for supplying a current to the second differential amplifier circuit, and
   wherein the current supplied from the first bias circuit to the second differential amplifier circuit is larger than the current supplied from the second bias circuit to the second differential amplifier circuit.

5. The voltage regulator according to claim 4, wherein when the operation control signal has the first logic value, the first bias circuit is in a suspended state.

6. The voltage regulator according to claim 1,
   wherein the second differential amplifier circuit comprises:
      a first MOS transistor which includes a gate connected to a first inverting input terminal;
      a second MOS transistor which includes a gate connected to the non-inverting input terminal and a source connected to a source of the first MOS transistor and which has the same conductivity as the first MOS transistor;

a current mirror circuit, for outputting a current to a drain of the first MOS transistor based on a current flowing into the second MOS transistor received as an input; and a third MOS transistor which includes a gate connected to a second inverting input terminal and a drain connected to the drain of the first MOS transistor and which is different in conductivity from the first MOS transistor and the second MOS transistor, and wherein the second differential amplifier circuit includes an output terminal, which is the output terminal of the current mirror circuit.

7. The voltage regulator according to claim 1, wherein the reference voltage circuit comprises:

a first reference voltage circuit; and a second reference voltage circuit, wherein when the operation control signal has the first logic value, the first reference voltage circuit is connected to the first differential amplifier circuit and the second differential amplifier circuit, and wherein when the operation control signal has the second logic value, the second reference voltage circuit is connected to the first differential amplifier circuit and the second differential amplifier circuit.

8. The voltage regulator according to claim 1, wherein the output transistor comprises:

a first output transistor; and a second output transistor, wherein when the operation control signal has the first logic value, the first output transistor operates, and wherein when the operation control signal has the second logic value, the first output transistor and the second output transistor operate.

9. The voltage regulator according to claim 1, wherein the second differential amplifier circuit comprises an offset reduction transistor.

10. The voltage regulator according to claim 6, wherein the second differential amplifier circuit comprises a switching circuit for interrupting a current flowing into the first MOS transistor in response to the operation control signal.

11. The voltage regulator according to claim 1, wherein the control circuit comprises a hysteresis circuit.

12. The voltage regulator according to claim 1, wherein the control circuit comprises a delay circuit.

* * * * *